(12) United States Patent
Yu et al.

(10) Patent No.: US 10,777,637 B2
(45) Date of Patent: Sep. 15, 2020

(54) INTEGRATED CIRCUIT PRODUCT WITH A MULTI-LAYER SINGLE DIFFUSION BREAK AND METHODS OF MAKING SUCH PRODUCTS

(71) Applicant: GLOBALFOUNDRIES Inc., Grand Cayman (KY)

(72) Inventors: Hong Yu, Clifton Park, NY (US);
Jiehui Shu, Clifton Park, NY (US);
Hui Zang, Guilderland, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 13 days.

(21) Appl. No.: 16/256,252

(22) Filed: Jan. 24, 2019

(65) Prior Publication Data
US 2020/0243643 A1 Jul. 30, 2020

(51) Int. Cl.
*H01L 29/06* (2006.01)
*H01L 29/66* (2006.01)
*H01L 27/088* (2006.01)
*H01L 21/8234* (2006.01)
*H01L 29/78* (2006.01)

(52) U.S. Cl.
CPC .. *H01L 29/0649* (2013.01); *H01L 21/823431* (2013.01); *H01L 21/823437* (2013.01); *H01L 21/823481* (2013.01); *H01L 27/0886* (2013.01); *H01L 29/66545* (2013.01); *H01L 29/66795* (2013.01); *H01L 29/7851* (2013.01)

(58) Field of Classification Search
CPC ........... H01L 29/0649; H01L 29/66545; H01L 29/66795; H01L 29/7851; H01L 27/0886; H01L 21/823431; H01L 21/823437; H01L 21/823481

USPC ......................................................... 257/401
See application file for complete search history.

(56) References Cited

U.S. PATENT DOCUMENTS

| | | | | |
|---|---|---|---|---|
| 5,960,270 A | * | 9/1999 | Misra | ................... H01L 21/2257 257/E21.151 |
| 6,406,975 B1 | * | 6/2002 | Lim | .................... H01L 21/76232 257/E21.549 |
| 8,609,510 B1 | * | 12/2013 | Banna | ................ H01L 29/66545 257/E21.409 |
| 8,846,491 B1 | | 9/2014 | Pham et al. | |
| 8,916,460 B1 | | 12/2014 | Kwon et al. | |
| 9,171,752 B1 | * | 10/2015 | Wu | .................... H01L 21/76224 |
| 2014/0117454 A1 | | 5/2014 | Liu et al. | |
| 2015/0147860 A1 | * | 5/2015 | Kim | ................... H01L 21/82343 438/283 |

(Continued)

*Primary Examiner* — Dzung Tran
(74) *Attorney, Agent, or Firm* — Amerson Law Firm, PLLC

(57) ABSTRACT

One illustrative integrated circuit product disclosed herein includes a single diffusion break (SDB) isolation structure positioned between a first fin portion and a second fin portion, wherein the first fin portion comprises a first end surface and the second fin portion comprises a second end surface. In this example, the SDB structure includes a conformal liner layer that engages the first end surface of the first fin portion and the second end surface of the second fin portion, an insulating material positioned on the conformal liner layer, a cap structure positioned above an upper surface of the insulating material and an air gap positioned between a bottom surface of the cap structure and the upper surface of the insulating material.

19 Claims, 23 Drawing Sheets

(56) References Cited

U.S. PATENT DOCUMENTS

2015/0255458 A1* 9/2015 Ando ................ H01L 29/42376
257/401
2016/0053181 A1* 2/2016 Ericsson ................ C10B 53/02
202/117
2016/0351663 A1* 12/2016 Park .................. H01L 29/41791

* cited by examiner

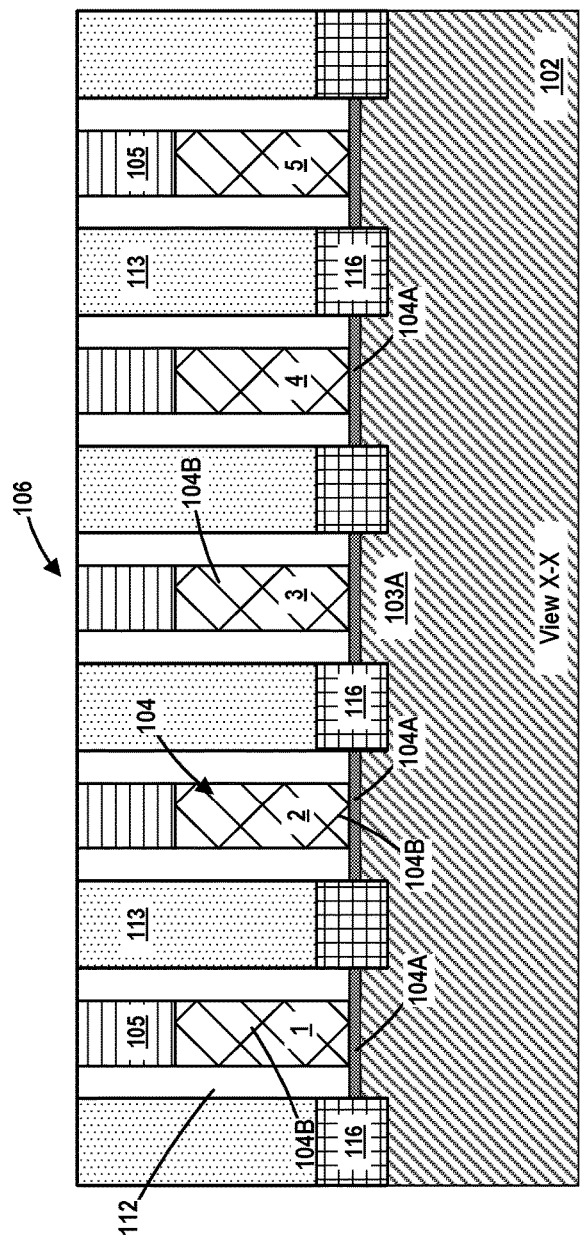
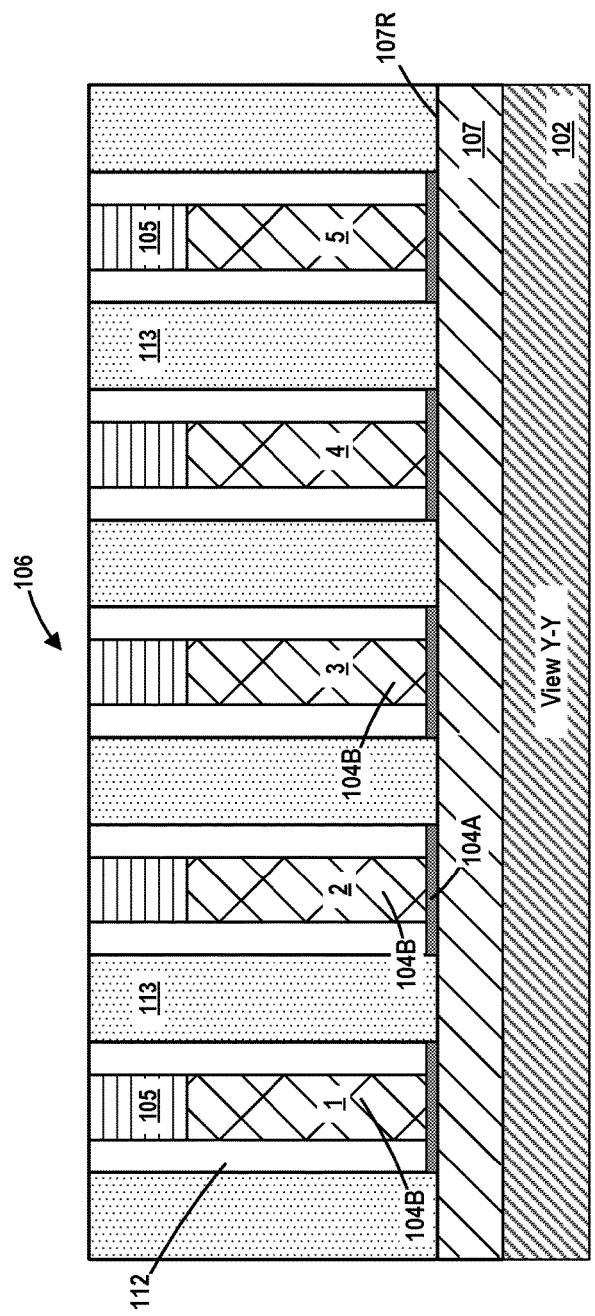

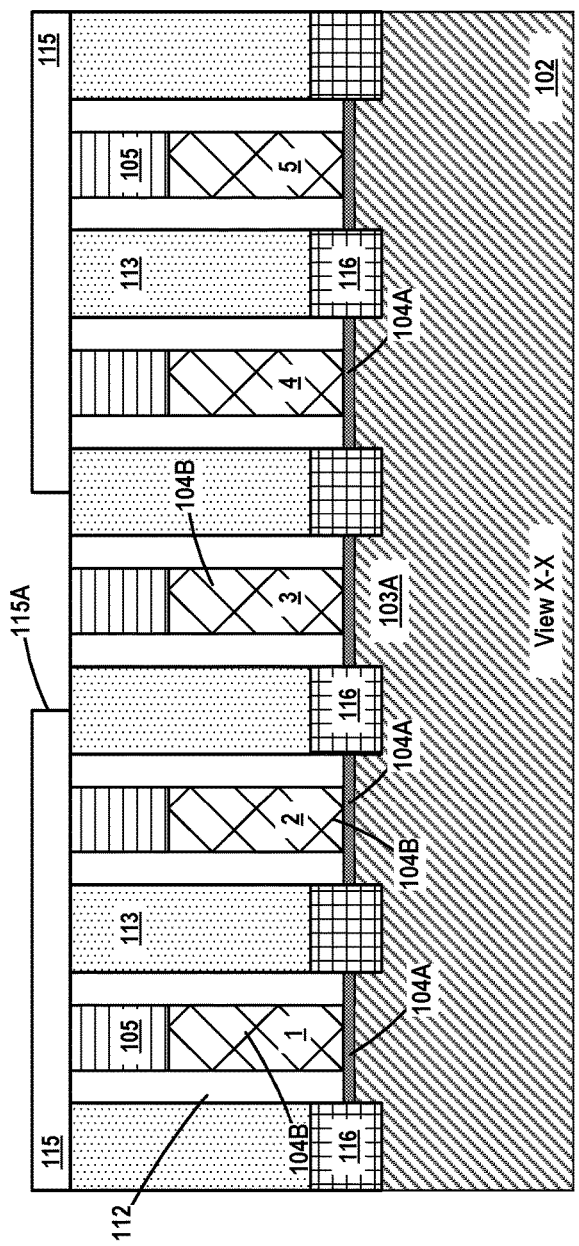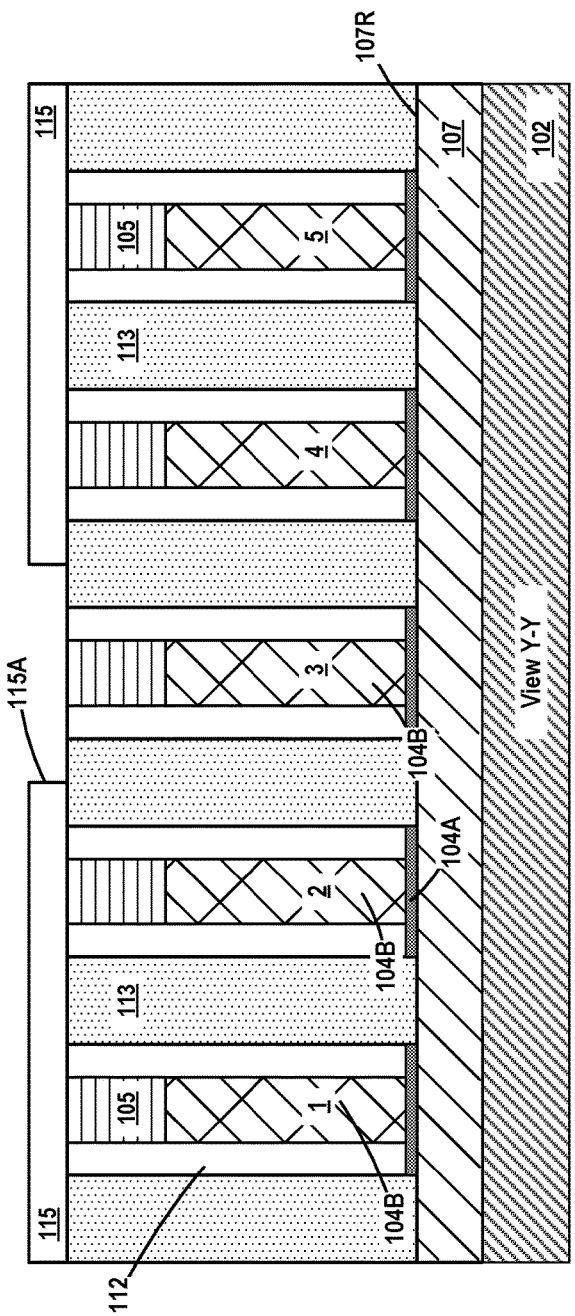

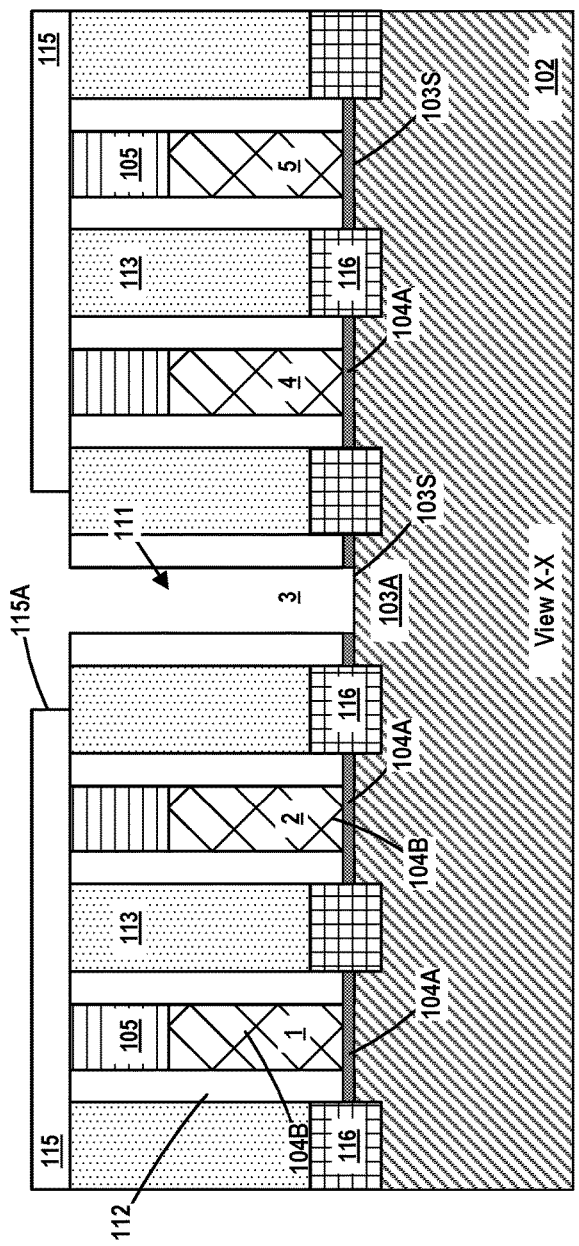
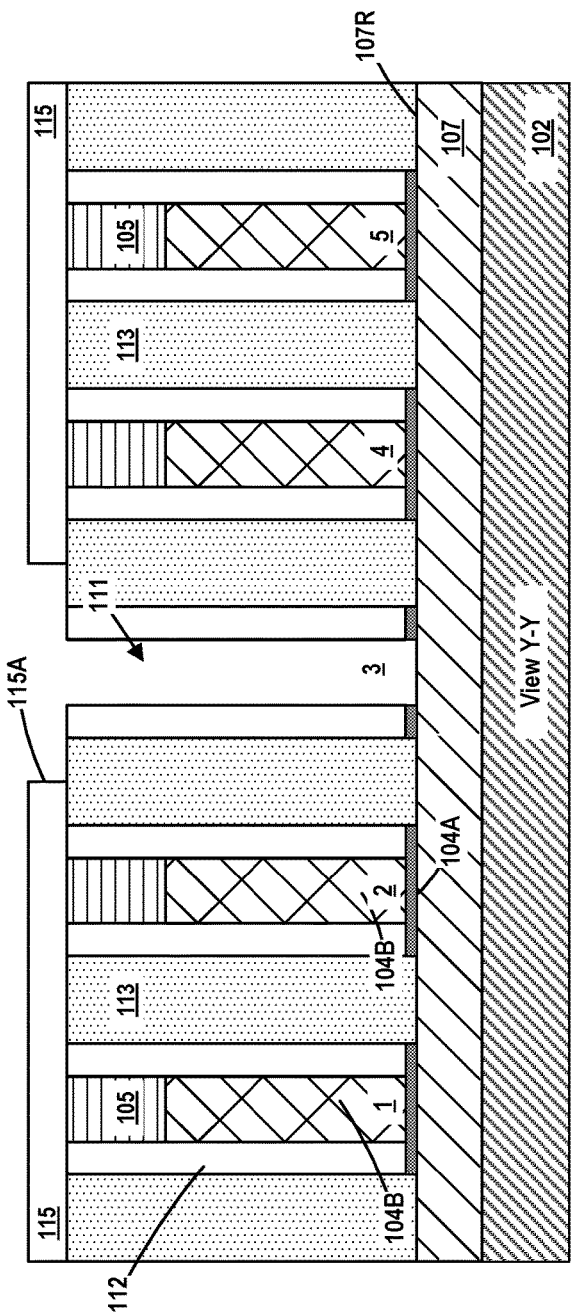

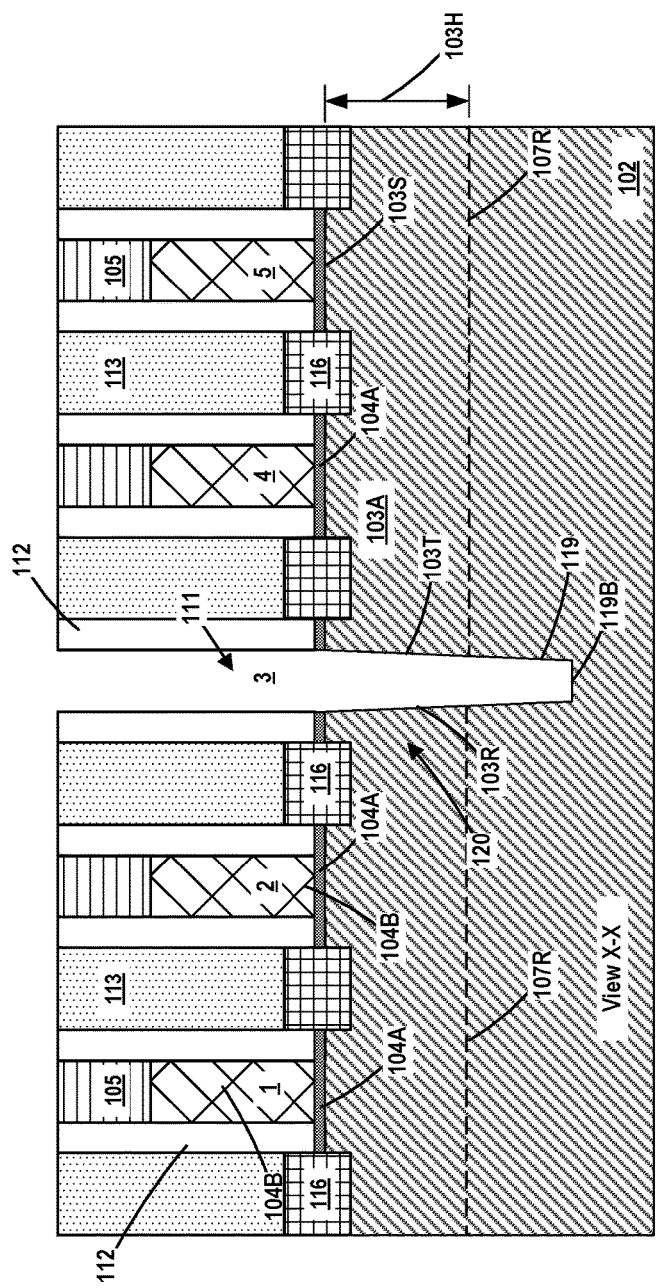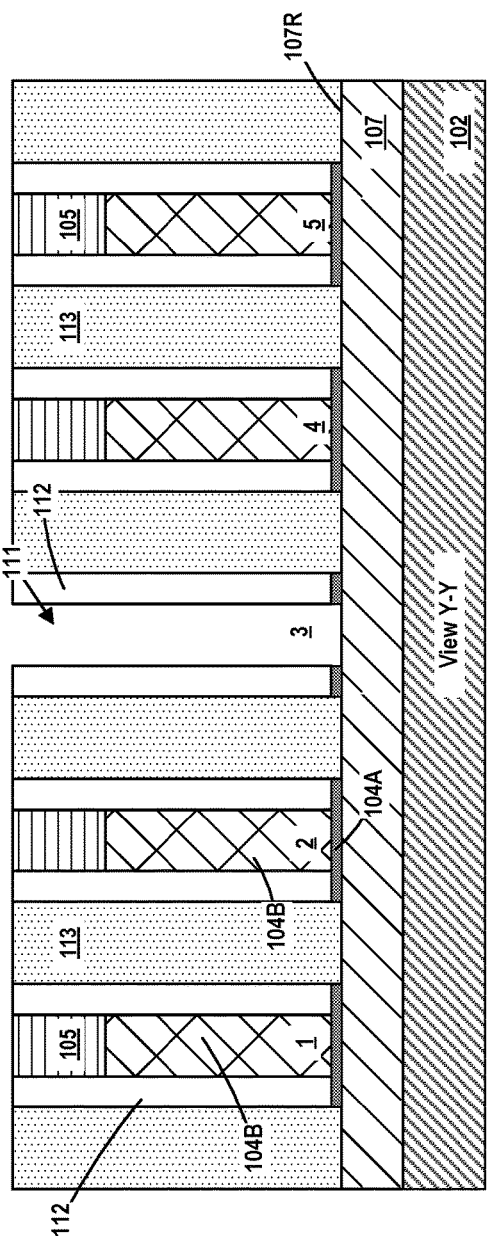

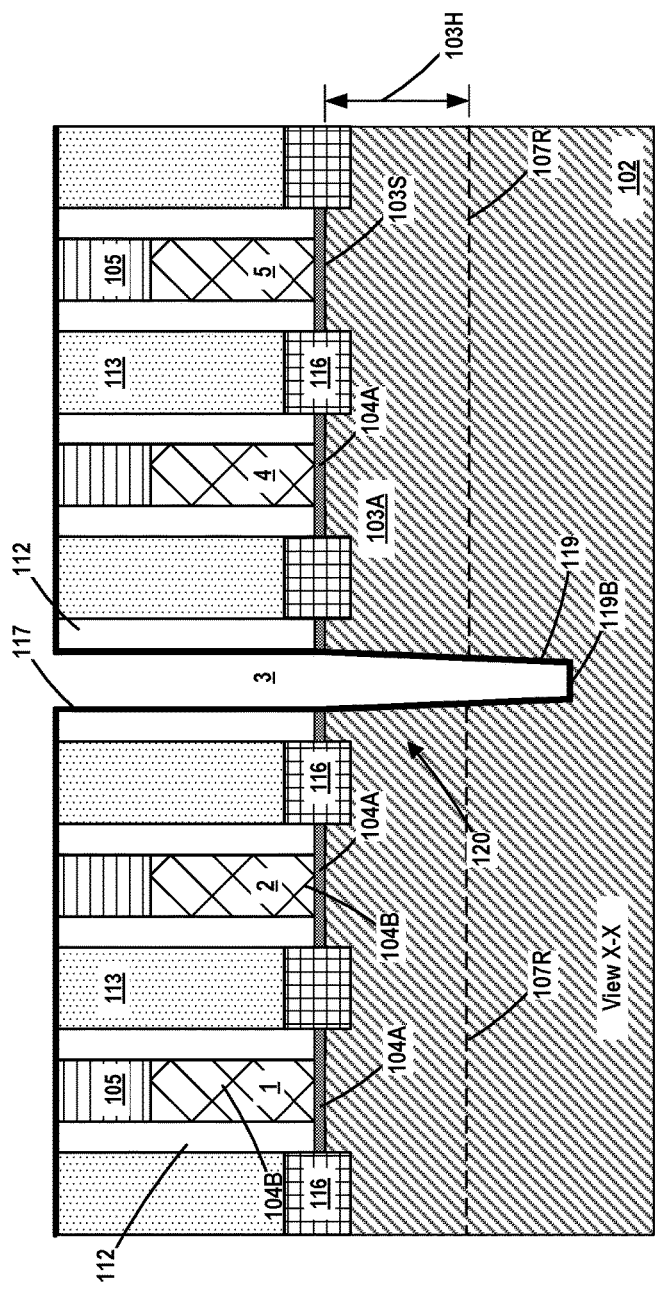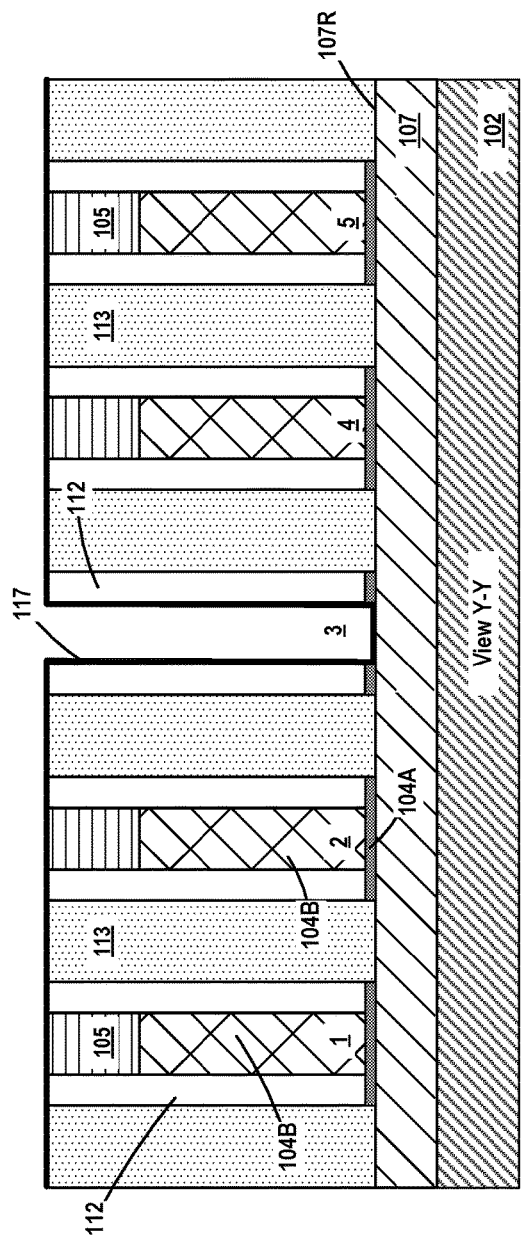

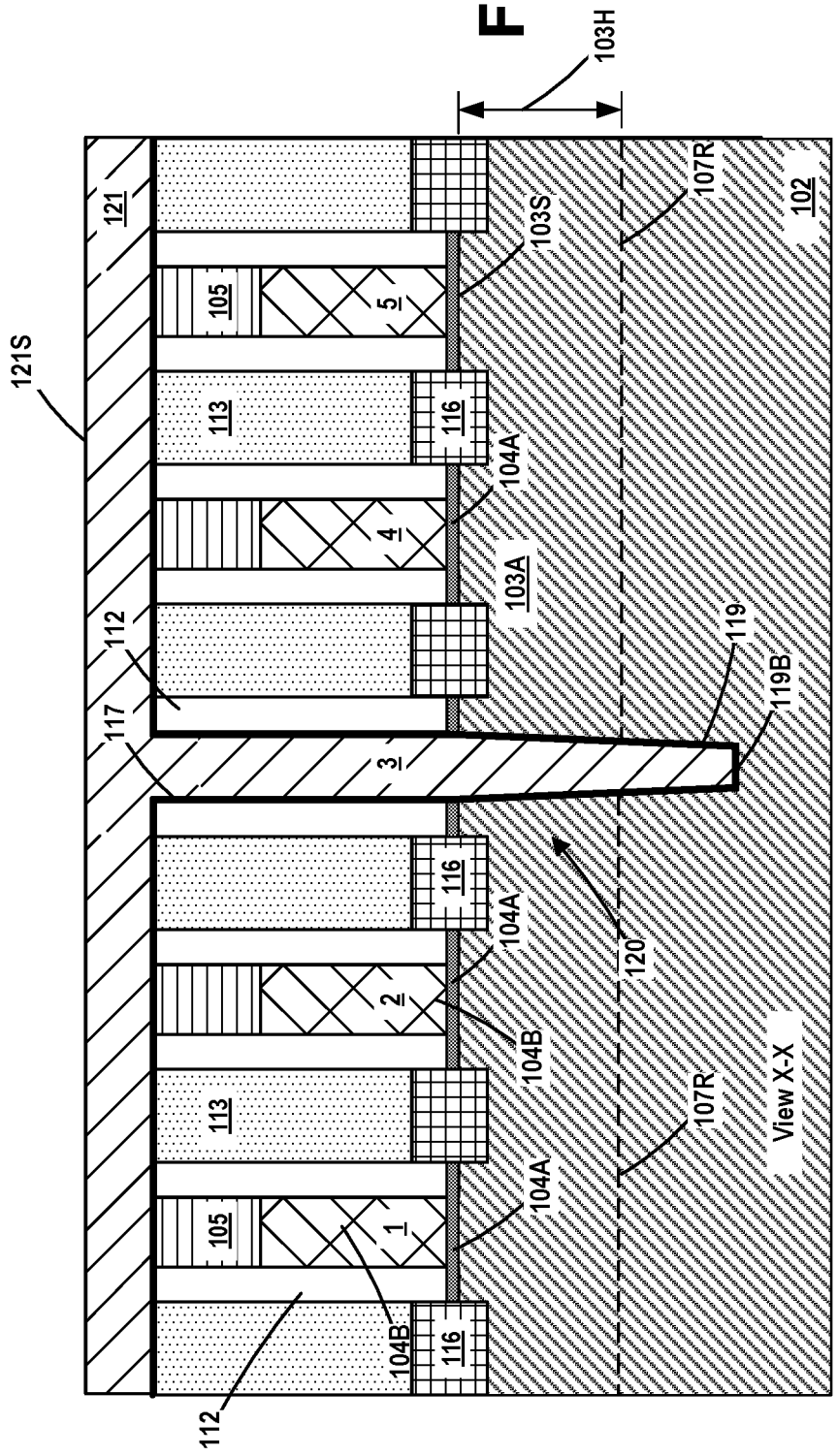

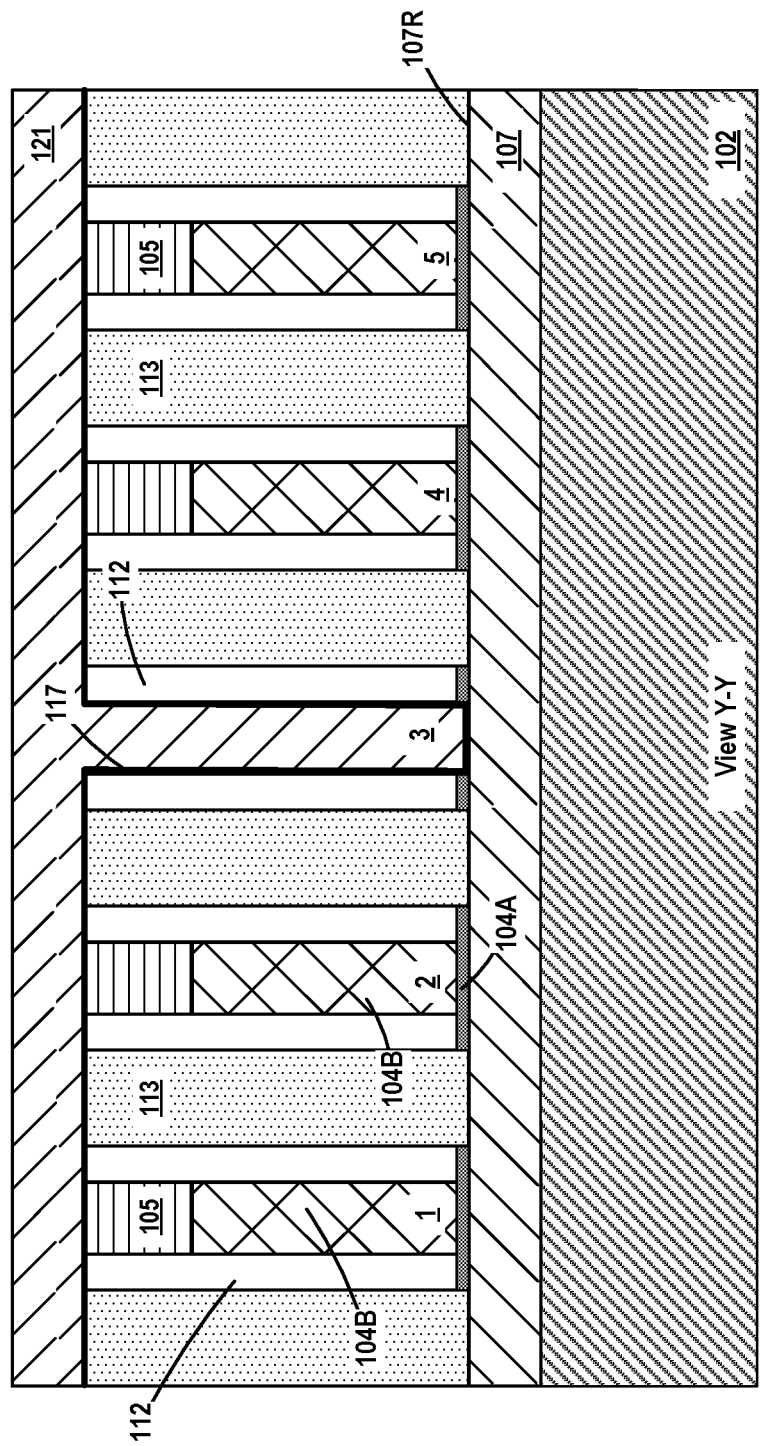

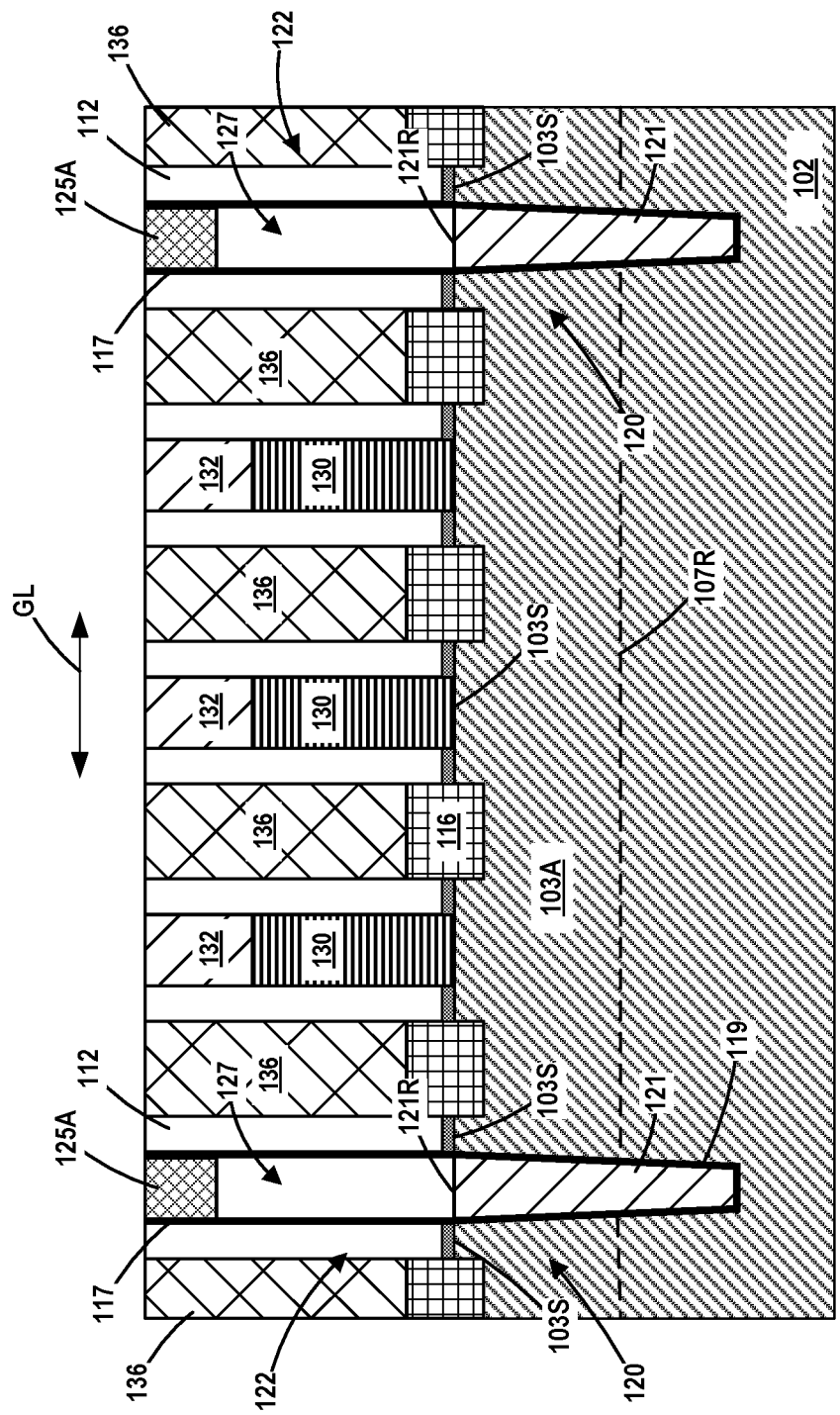

US 10,777,637 B2

INTEGRATED CIRCUIT PRODUCT WITH A MULTI-LAYER SINGLE DIFFUSION BREAK AND METHODS OF MAKING SUCH PRODUCTS

BACKGROUND

1 Field of the Disclosure

Generally, the present disclosure relates to the manufacture of semiconductor devices, and, more specifically, to various novel embodiments of an integrated circuit (IC) product with a multi-layer single diffusion break (SDB) and methods of making such IC products.

2. Description of the Related Art

In modern integrated circuits, such as microprocessors, storage devices and the like, a very large number of circuit elements, especially transistors, are provided on a restricted chip area. Transistors come in a variety of shapes and forms, e.g., planar transistors, FinFET transistors, nanowire devices, etc. The transistors are typically either NMOS (NFET) or PMOS (PFET) type devices wherein the "N" and "P" designation is based upon the type of dopants used to create the source/drain regions of the devices.

The various transistor devices that are formed for an IC product must be electrically isolated from one another to properly function in an electrical circuit. Typically, this is accomplished by forming a trench in the substrate, and filling the trench with an insulating material, such as silicon dioxide. However, the formation of such trenches consumes very valuable plot space on the substrate. Moreover, in some applications, such as those integrated circuit products employing FinFET transistor devices, as device sizes have decreased, and packing densities have increased, it is sometimes difficult to form the desired isolation region made of an insulating material. As a result, in at least some IC products, single break diffusion (SDB) isolation structures are formed to electrically isolate devices from one another. In one illustrative process flow, an SDB isolation structure may be formed by removing a portion of a sacrificial gate structure, etching a trench into the substrate and thereafter filling the opening with an insulating material. Ultimately, conductive source/drain contact structures (e.g., trench silicide structures) will be formed that are conductively coupled to regions of epi semiconductor material formed in the source/drain regions of the transistor device. The conductive source/drain contact structures that are separated by the SDB isolation structure define a parasitic capacitor which will charge and discharge every operational cycle of the transistor, and may cause degradation in device performance. Unfortunately, the adverse effects of such parasitic capacitors may only increase as device dimensions continue to decrease.

The present disclosure is directed to various novel embodiments of an integrated circuit (IC) product with a multi-layer single diffusion break (SDB) and methods of making such IC products that may solve or reduce one or more of the problems identified above.

SUMMARY

The following presents a simplified summary of at least one disclosed embodiment in order to provide a basic understanding of some aspects of the subject matter disclosed herein. This summary is not an exhaustive overview of all of the subject matter disclosed herein. It is not intended to identify key or critical elements of the subject matter disclosed herein or to delineate the scope of any claims directed to any of the subject matter disclosed herein. Its sole purpose is to present some concepts in a simplified form as a prelude to the more detailed description that is discussed later in the application.

Generally, the present disclosure is directed to various novel embodiments of an integrated circuit (IC) product with a multi-layer single diffusion break (SDB) and methods of making such IC products. One illustrative integrated circuit product disclosed herein includes a single diffusion break (SDB) isolation structure positioned between a first fin portion and a second fin portion, wherein the first fin portion comprises a first end surface and the second fin portion comprises a second end surface. In this example, the SDB structure comprises a conformal liner layer that engages the first end surface of the first fin portion and the second end surface of the second fin portion, an insulating material positioned on the conformal liner layer, a cap structure positioned above an upper surface of the insulating material and an air gap positioned between a bottom surface of the cap structure and the upper surface of the insulating material.

One illustrative method disclosed herein includes forming a gate above a portion of an axial length of a fin, the gate comprising a sacrificial gate structure and a sacrificial gate cap, the gate having an axial length, forming a sidewall spacer adjacent the gate and performing at least one etching process to remove a portion of the axial length of the sacrificial gate cap and the sacrificial gate structure such that an interior surface of the sidewall spacer partially defines an opening that is positioned above the fin. In this example, the method also includes performing at least one etching process to remove a portion of the fin below the opening and forming a trench that extends into the semiconductor substrate, thereby separating the fin into a first fin portion and a second fin portion, wherein a combination of the opening and the trench define an isolation structure opening, and forming a conformal liner layer within the isolation structure opening to line the trench, the conformal liner layer contacting and engaging a first end surface of the first fin portion and a second end surface of the second end portion as well as the inner surface of the sidewall spacer. This illustrative example also includes forming an insulating material on and in contact with the conformal liner layer within the isolation structure opening, wherein an upper surface of the insulating material is positioned at a level that is at or above the first level, and forming a cap structure that contacts the conformal liner layer such that an air gap exists between a bottom surface of the cap structure and the upper surface of the insulating material thereby forming a single diffusion break (SDB) isolation structure within the isolation structure opening, wherein the SDB structure comprises the conformal liner layer, the insulating material, the air gap and the cap structure.

BRIEF DESCRIPTION OF THE DRAWINGS

The disclosure may be understood by reference to the following description taken in conjunction with the accompanying drawings, in which like reference numerals identify like elements, and in which:

FIGS. 1-28 depict various illustrative and novel embodiments of an integrated circuit (IC) product with a multi-layer single diffusion break (SDB) and methods of making such IC products.

Figure 1:
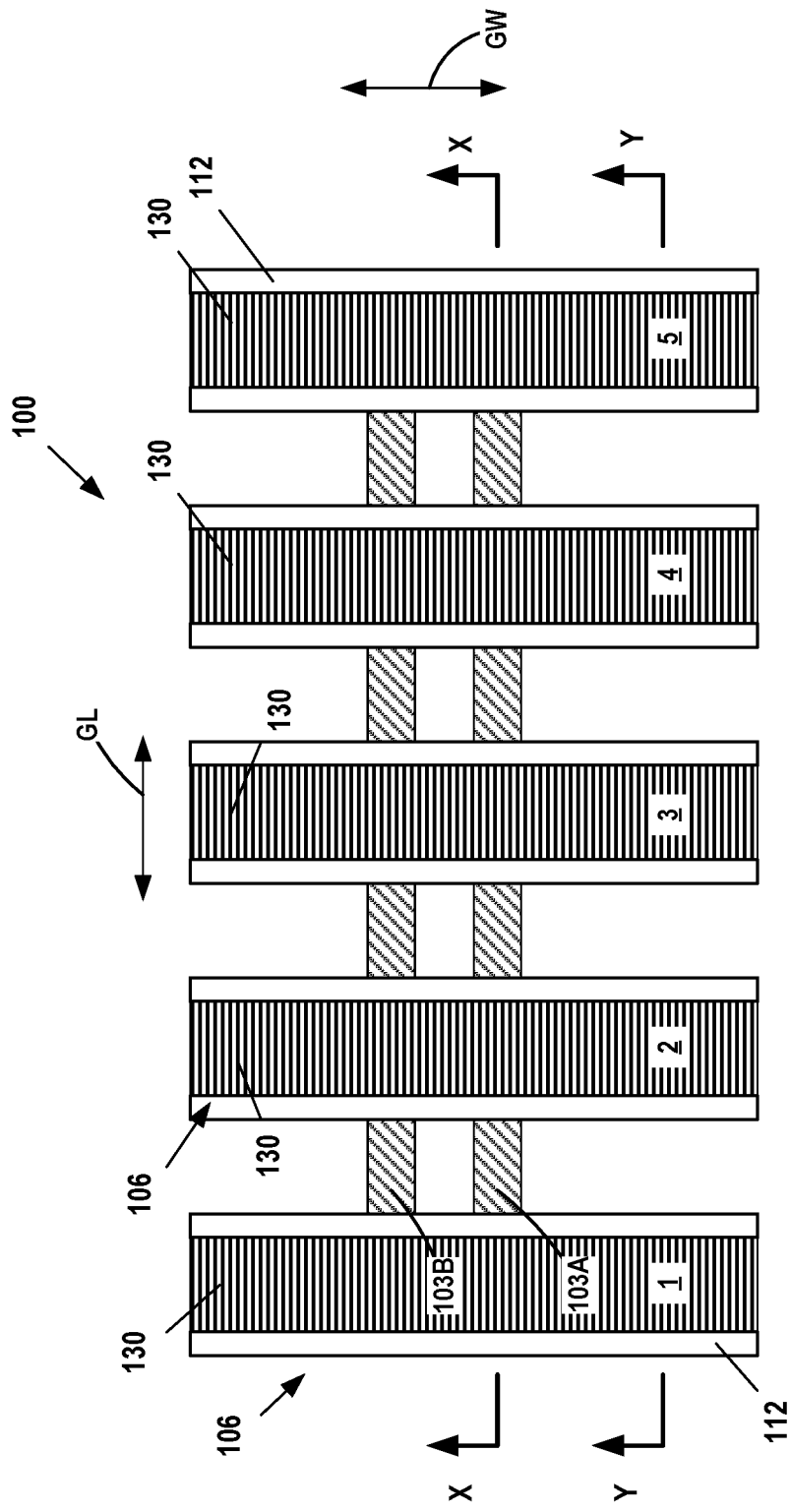

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase. As will be readily apparent to those skilled in the art upon a complete reading of the present application, the methods disclosed herein may be employed in manufacturing a variety of different devices, including, but not limited to, logic devices, memory devices, etc., and the devices may be may be either NMOS or PMOS devices.

As will be appreciated by those skilled in the art after a complete reading of the present application, various doped regions, e.g., source/drain regions, halo implant regions, well regions and the like, are not depicted in the attached drawings. Of course, the inventions disclosed herein should not be considered to be limited to the illustrative examples depicted and described herein. The various components and structures of the integrated circuit devices 100 disclosed herein may be formed using a variety of different materials and by performing a variety of known techniques, e.g., a chemical vapor deposition (CVD) process, an atomic layer deposition (ALD) process, a thermal growth process, spin-coating techniques, etc. The thicknesses of these various layers of material may also vary depending upon the particular application. With reference to the attached figures, various illustrative embodiments of the methods and devices disclosed herein will now be described in more detail.

FIGS. 1-28 depict various illustrative and novel embodiments of an integrated circuit (IC) product 100 with a multi-layer single diffusion break (SDB) and methods of making such IC products. FIG. 1 depicts a plurality of fins 103A-B (collectively referenced using the numeral 103) that were formed in a semiconductor substrate 102 (see FIG. 2), as well as a plurality of gates 106 (numbered 1-5 for ease of reference) that were formed on the IC product 100 for various transistor devices. The depicted transistor device comprises two illustrative fins 103A-B. In practice, the device may comprise one or more fins 103. The operations described below with respect to items formed on or to the fin 103A apply equally to fin 103B, and vice versa. Each of the gates 106 comprises an illustratively depicted final gate structure 130 that will eventually be formed on the product using replacement gate manufacturing techniques. A final gate cap that is positioned above each of the final gate structures 130 is not shown in FIG. 1. Also depicted in FIG. 1 are illustrative sidewall spacers 112 formed adjacent the final gate structures 130.

Still with reference to FIG. 1, various cross-sectional views ("X-X" and "Y-Y") of the product 100 that are depicted in the attached drawings are taken where indicated in FIG. 1. The cross-sectional views X-X and Y-Y are taken in the gate length (GL—current transport) direction of the transistor devices. More specifically, with reference to FIG. 1, the view X-X is a cross-sectional view taken along the long axis (i.e., the axial length) of the fin 103A. The view Y-Y is a cross-sectional view taken through the final gate structures 130 at a location above isolation material 107 (see FIG. 2), e.g., outside of the active region of the transistor devices. The isolation material 107 electrically isolates one transistor device from an adjacent transistor device (not shown). Other views are taken where indicated in the attached drawings.

In the examples depicted herein, the integrated circuit product 100 will be formed in and above a semiconductor substrate 102. The substrate 102 may have a variety of configurations, such as a silicon-on-insulator (SOI) or silicon-germanium-on-insulator (SGOI) configuration that includes a base semiconductor layer, a buried insulation layer and an active layer. Alternatively, the substrate 102 may have a simple bulk configuration. The substrate 102 may be made of silicon or it may be made of materials other than silicon. Thus, the terms "substrate" or "semiconductor substrate" should be understood to cover all semiconducting materials and all forms of such materials.

FIGS. 2-3 depict the product 100 after several process operations were performed. More specifically, the fins 103 were formed in the substrate 102 using traditional manufacturing techniques. For example, a patterned fin-formation etch mask (not shown—comprised of, for example, a layer of silicon dioxide and a layer of silicon nitride) was formed above the substrate 102. Thereafter, one or more etching processes, e.g., anisotropic etching processes, were performed through the patterned fin-formation etch mask to form a plurality of fin-formation trenches in the substrate 102 and thereby define the plurality of fins 103. The width and height of the fins 103 may vary depending upon the particular application. Additionally, the overall size, shape and configuration of the fin-formation trenches and fins 103 may vary depending on the particular application. Next, a recessed layer of isolation material 107 (e.g., silicon dioxide) with a recessed upper surface 107R was formed between the fins 103 by performing traditional manufacturing techniques, e.g., depositing the insulating material and thereafter performing a recess etching process. Thereafter, at least portions of the patterned fin-formation etch mask were removed.

The final gate structures 130 for the transistor devices disclosed herein will be manufactured using one illustrative embodiment of a replacement gate (or "gate-last") manufacturing technique. Accordingly, still referencing FIGS. 2-3, after the formation of the fins 103, a plurality of sacrificial (or "dummy") gate structures 104, with a sacrificial gate cap 105 formed thereabove, were formed across the substrate 102. In one illustrative and non-limiting process flow, each of the sacrificial structures 104 comprises a sacrificial gate insulation layer 104A (e.g., silicon dioxide) and a sacrificial gate electrode material 104B (e.g., polysilicon or amorphous silicon). In the depicted example, the sacrificial gate insulation layer 104A was formed by performing a conformal deposition process. In other embodiments, the sacrificial gate insulation layer 104A may be formed by performing a thermal growth process. A sacrificial gate cap 105 (e.g., silicon nitride) is positioned above each of the sacrificial gate structures 104. In one illustrative process flow, the sacrificial gate structures 104 (with the gate cap 105 thereabove) are initially formed as continuous line-type structures that extend across substantially the entire substrate 102, including across both active regions and isolation regions located between active regions. The long continuous line-type sacrificial gate 104/gate cap 105 structures may be formed by depositing the materials for the sacrificial gate structures 104 as well as a layer of material for the sacrificial gate caps 105 across the entire substrate 102, forming a patterned gate etch mask (not shown) above the deposited layer of the material for the sacrificial gate caps 105, and performing one or more etching processes through the patterned gate etch mask to remove the exposed portions of sacrificial gate cap material and, thereafter, the exposed portions of the sacrificial gate materials.

Next, still referencing FIGS. 2-3, a sidewall spacer structure 112 (e.g., silicon nitride, a low-k material (k value of 3.3 or less), etc.) was formed adjacent the long continuous line-type sacrificial gate structures 104 and gate caps 105. The spacer 112 may be formed by depositing a conformal layer of spacer material and thereafter performing an anisotropic etching process. Various process operations are typically performed with the sacrificial gate structures 104, gate caps 105 and spacers 112 in position, e.g., source/drain implantation processes, the formation of epi semiconductor material 116 in the source/drain regions of the transistor devices, etc. Then, a conformal contact etch stop layer (not shown, e.g., silicon nitride) was formed on the product 100 and above the epi semiconductor material 116. At that point, a layer of insulating material 113 (e.g., silicon dioxide) was blanket-deposited across the product 100 so as to over-fill the open spaces between the spacers 112. Thereafter, a CMP and/or etch-back process was performed to planarize the upper surface of the layer of insulating material 113 with the upper surface of the sacrificial gate caps 105. In one illustrative process flow, the materials of the sacrificial gate caps 105, the spacers 112 and the insulating material 113 may be comprised of materials that permit these structures to be selectively etched relative to one another. In one illustrative example, the sacrificial gate caps 105 may be comprised of silicon nitride, the spacers 112 may be comprised of silicon nitride, SiNC, etc. and the insulating material 113 may be silicon dioxide. In other cases, the sacrificial gate caps 105 and the spacers 112 may be made of the same material, e.g., silicon nitride, and the insulating material may be silicon dioxide.

FIGS. 4-5 depict the product 100 after a patterned etch mask 115, e.g., a patterned OPL layer or photoresist, was formed on the product 100 by performing traditional manufacturing techniques. The patterned etch mask 115 comprises an opening 115A located above gate 3. As described more fully below, the opening 115A is positioned at a location wherein it is desired to remove a portion of the axial length (in the gate width direction of the devices) of the sacrificial gate structure 104 of gate 3 and thereafter form an isolating single diffusion break (SDB) structure 122 in its place.

FIGS. 6-7 depict the product 100 after several process operations were performed. First, an etching process was performed to remove a portion of the axial length (in the gate width direction of the devices) of the sacrificial gate cap 105 of gate 3 above the fin 103A relative to the surrounding materials. The amount of the axial length of the sacrificial gate cap 105 removed corresponds approximately to the size of the opening 115A in the gate width direction (i.e., into and out of the plane of the drawing page) of the devices. The process operation exposes a portion of the axial length of the sacrificial gate structure 104 of gate 3. Next, one or more etching processes were performed to remove the exposed portions of the sacrificial gate structure 104 of gate 3 relative to the surrounding materials. These process operations effectively form an opening 111 in the area of the removed portions of the gate structure 104. As depicted, the opening 111 is at least partially defined (in the gate length direction) by the inner surface of the sidewall spacer 112.

FIGS. 8-9 depict the product 100 after a selective etching process was performed to remove exposed portions of the fins 103A/B within the opening 111. This process operation results in the formation of a plurality of trenches 119 (one of which is shown in FIG. 8) that extends downward into the substrate 102 to a depth that is below the bottom surface of the isolation material 107. A trench 119 that extends downward into the substrate 102 will be formed in the area of each of the fins 103A, 103B. In the depicted example, the combination of the opening 111 and the trenches 119 define an isolation structure opening 120. The depth of the trenches 119 may vary depending upon the particular application. In one illustrative example, the bottom 119B of the trenches 119 extends to a depth that is below the level of the recessed surface 107R of the isolation material 107. In one illustrative example, the distance between the recessed surface 107R and the bottom 119B of the trenches 119 may be about 20-80 nm. The exposed height 103H of the fins 103 above the recessed upper surface 107R of the isolation material 107 is also depicted in FIG. 8. The absolute magnitude of the exposed height 103H of the fins 103 may vary depending upon the particular application. Note that this process operation effectively cuts the fin 103A into a first fin portion (to the left of the trench 119) and a second fin portion (to the right of the trench 119). The first fin portion has a first end surface 103R, while the second fin portion has a second end surface 103T.

FIGS. 10-11 depict the product 100 after a conformal liner layer 117 was formed across the product 100 and in the isolation structure opening 120. As described more fully below, in this illustrative process flow, the liner layer 117 will function as an etch-stop layer with respect to some of the processing operations described below. The conformal liner layer 117 may be formed by performing a conformal deposition process, e.g., a conformal ALD process. The conformal liner layer 117 may be comprised of a variety of different materials, e.g., a metal oxide, such as, for example, aluminum oxide, titanium oxide, a high-k insulating material (k value of 9 or greater), such as hafnium oxide, etc., and its thickness may vary depending upon the particular application. As depicted, in one illustrative embodiment, the conformal liner layer 117 lines the trench 119 and is formed on and in contact with the inner surface of the spacer 112.

FIGS. 12-13 depict the product 100 after an insulating material 121 was formed in the isolation structure opening 120, e.g., in the opening 111 and in the trenches 119. The insulating material 121 has an as-deposited upper surface 121S. The insulating material 121 may be comprised of a variety of different materials (e.g., silicon dioxide, SiN, SiNC, SiCOH, SiC, etc.). The insulating material 121 may be blanket-deposited across the product 100 so as to over-fill the isolation structure opening 120.

Figure 14:
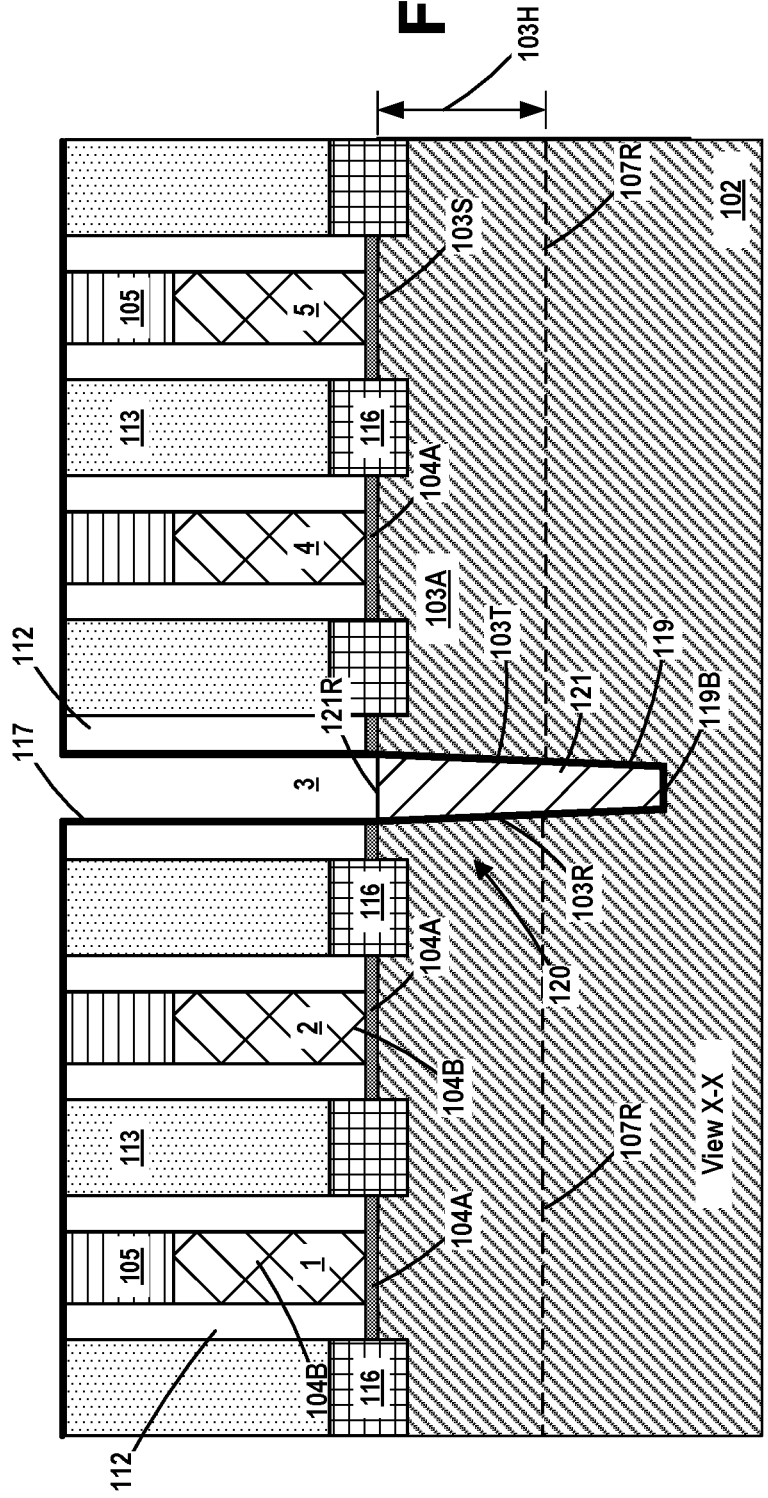
Figure 15:
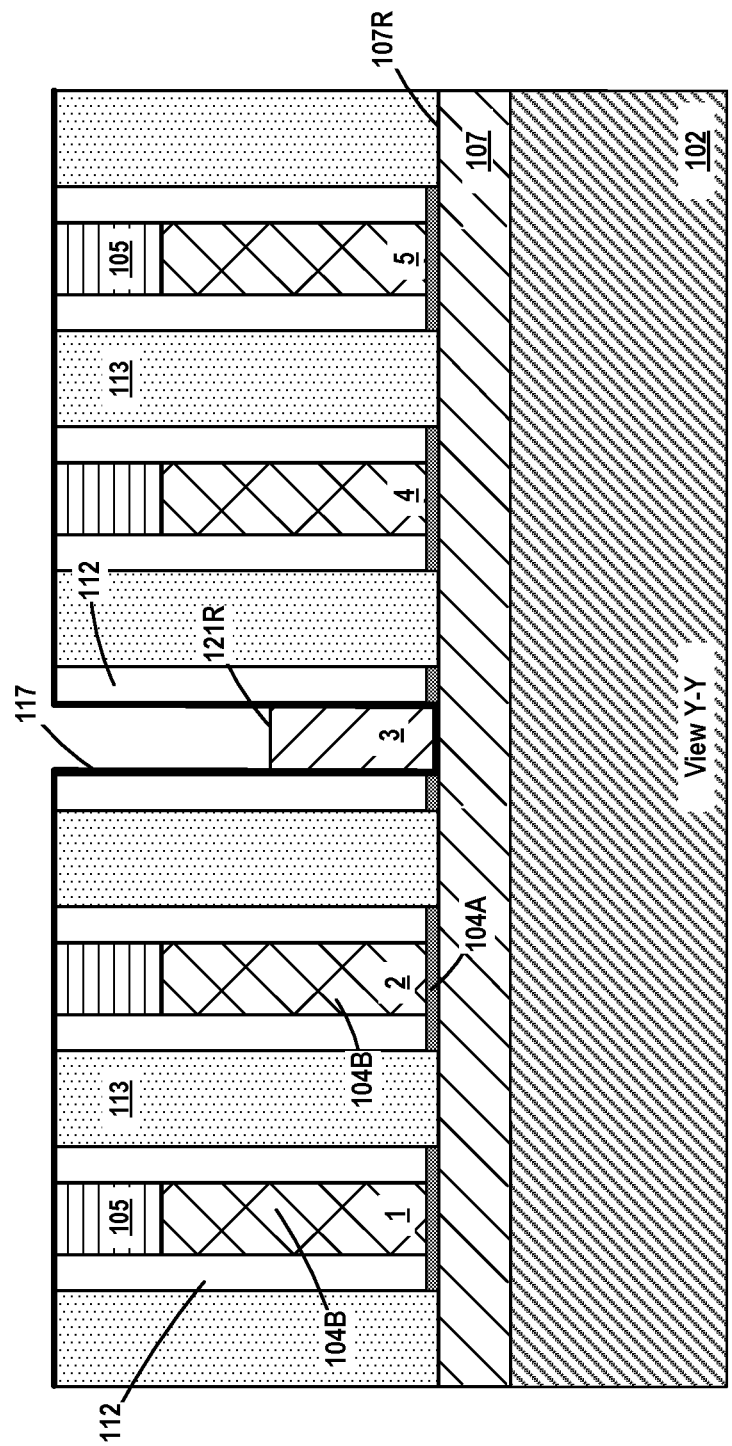

FIGS. 14-15 depict the product 100 after at least a recess etching process was performed on the insulating material 121 with the conformal liner layer 117 in position to protect the underlying structures. At the conclusion of the recess etching process, the insulating material 121 has a recessed upper surface 121R. The amount of recessing of the insulating material 121 may vary depending upon the particular application. In one illustrative embodiment, the recessed upper surface 121R may be positioned approximately level with the upper surface 103S of the fin 103. In other applications, the recessed upper surface 121R may be positioned at a level that is approximately 1-10 nm above the upper surface 103S of the fin 103.

Figure 16:
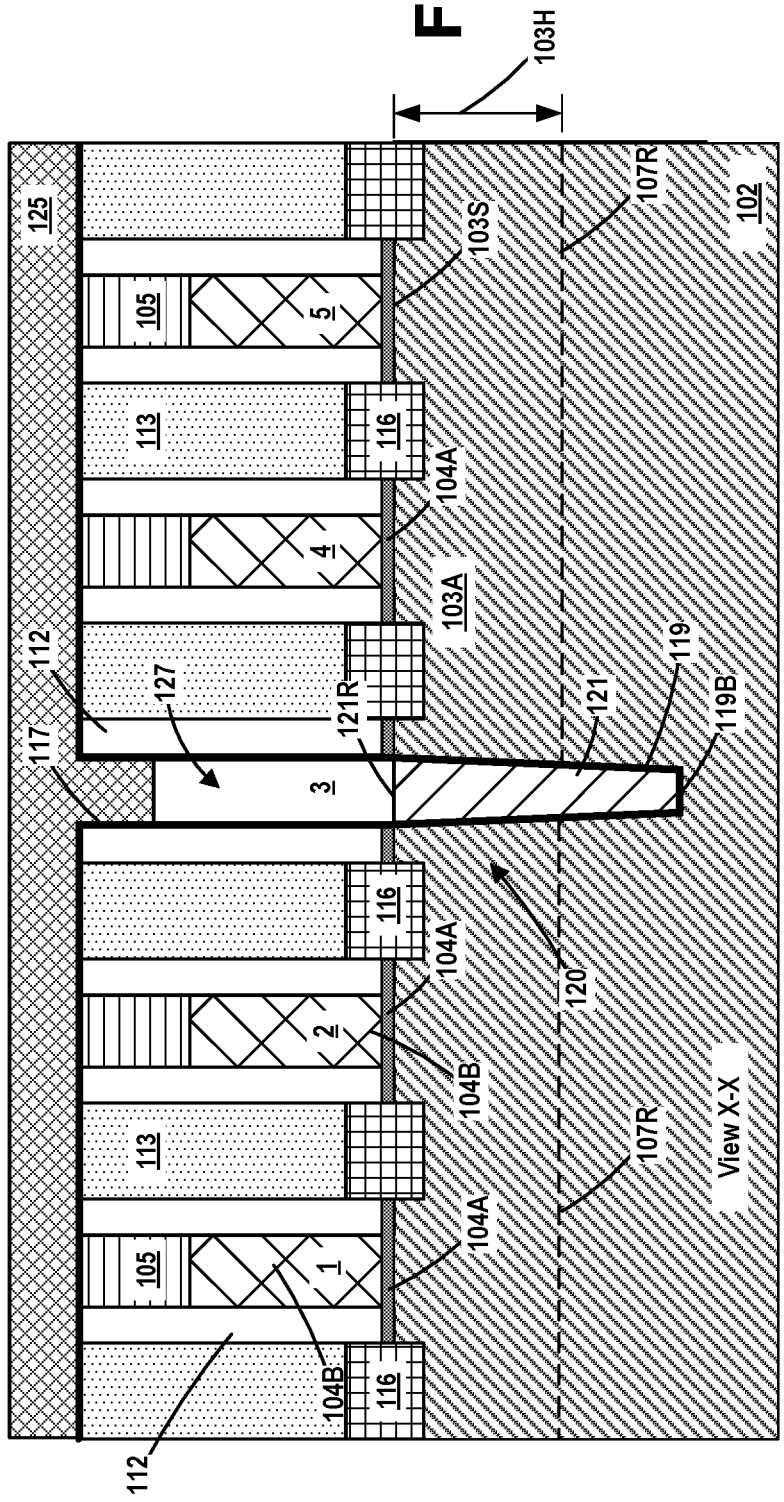
Figure 17:
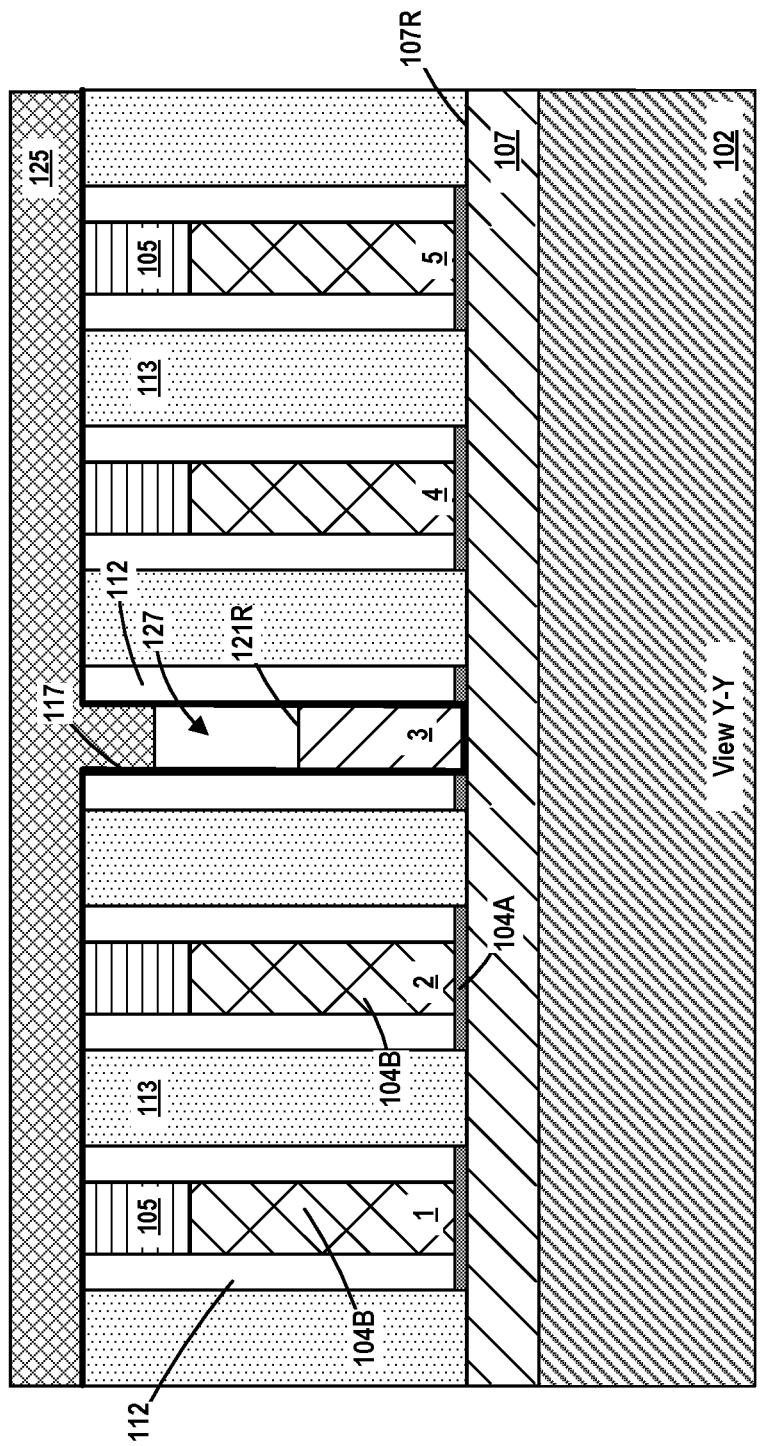

FIGS. 16-17 depict the product 100 after an insulating cap material 125 for an SDB cap structure was formed in the isolation structure opening 120 above the recessed layer of insulating material 121. In one embodiment, the insulating cap material 125 was formed on and in contact with the conformal liner layer 117. The insulating cap material 125 may be comprised of a variety of different materials (e.g., SiN, SiNC, SiCOH, SiC, etc.). The insulating cap material 125 may be formed in such a manner, e.g., by performing a CVD process, to ensure that it "pinches-off" and does not effectively fill the space above the recessed layer of insulating material 121 within the isolation structure opening 120. This process operation results in the formation of an air gap 127 above the recessed layer of insulating material 121.

Figure 18:
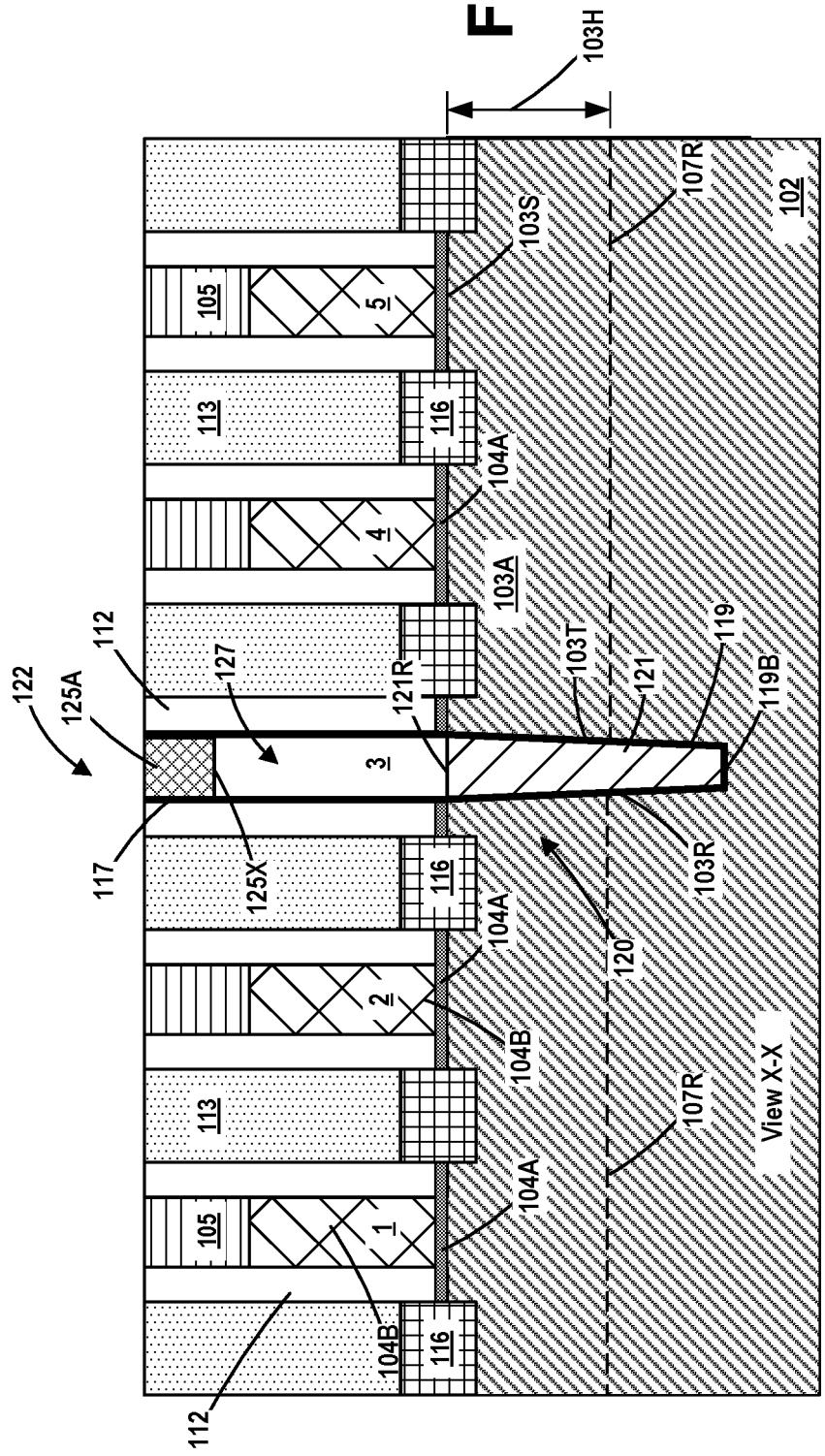
Figure 19:
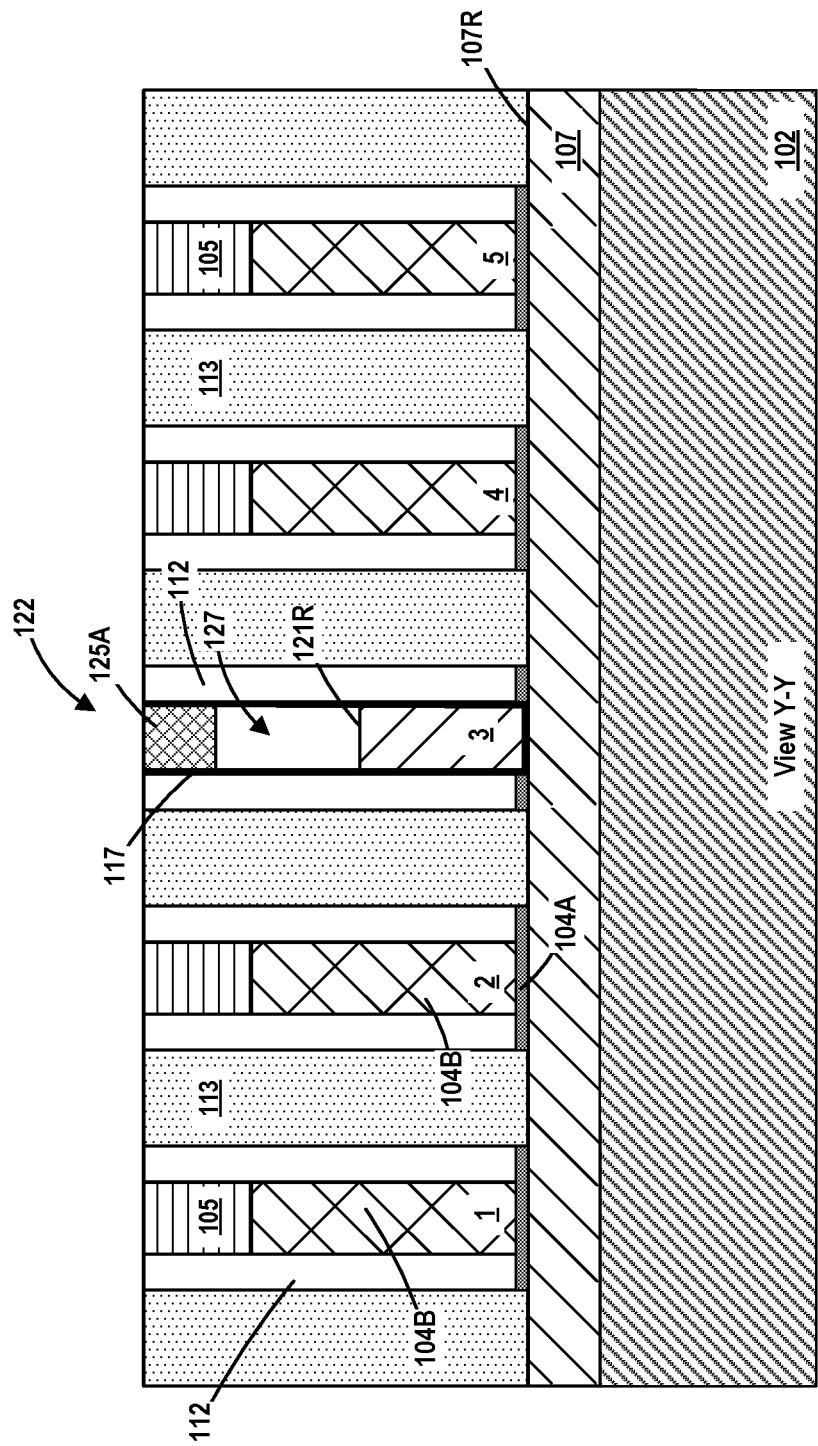

FIGS. 18-19 depict the product 100 after one or more CMP and/or etch-back processes were performed to remove excess amounts of the insulating cap material 125 and the conformal liner layer 117 positioned outside of the isolation structure opening 120. This process results in the formation of an SDB cap structure 125A. The vertical thickness of the SDB cap structure 125A may vary depending upon the particular application, e.g., 20-80 nm. In practice, the SDB cap structure 125A need only be thick enough to withstand mechanical stresses imposed by subsequent processing operations. As will be appreciated by those skilled in the art after a complete reading of the present application, the thinner the SDB cap structure 125A can be made, the greater will be the vertical extent of the air gap 127. In one illustrative embodiment, based upon current day technology, the length of the air gap 127 in the vertical direction may be about 30-80 nm.

Figure 20:
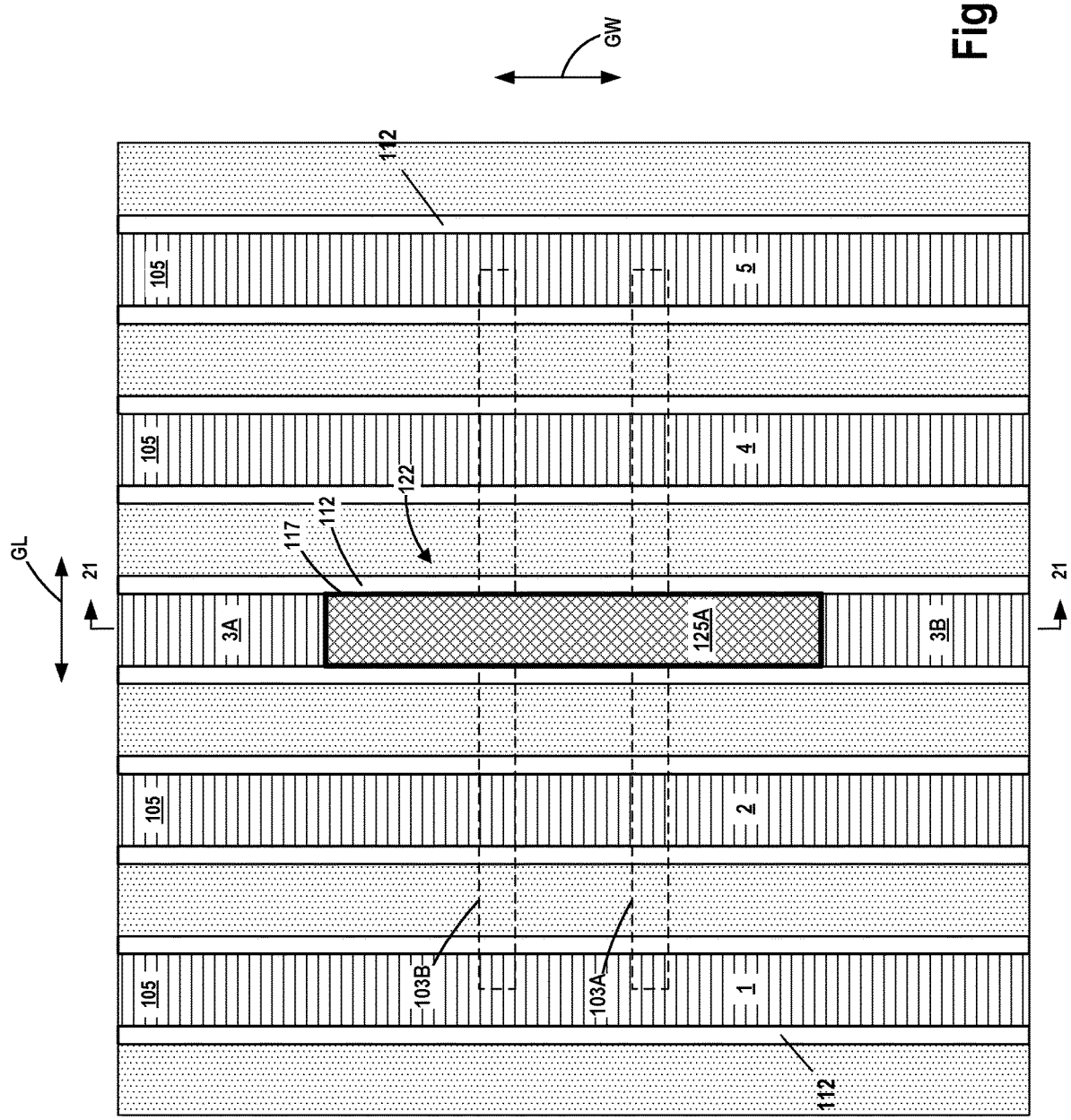
Figure 21:
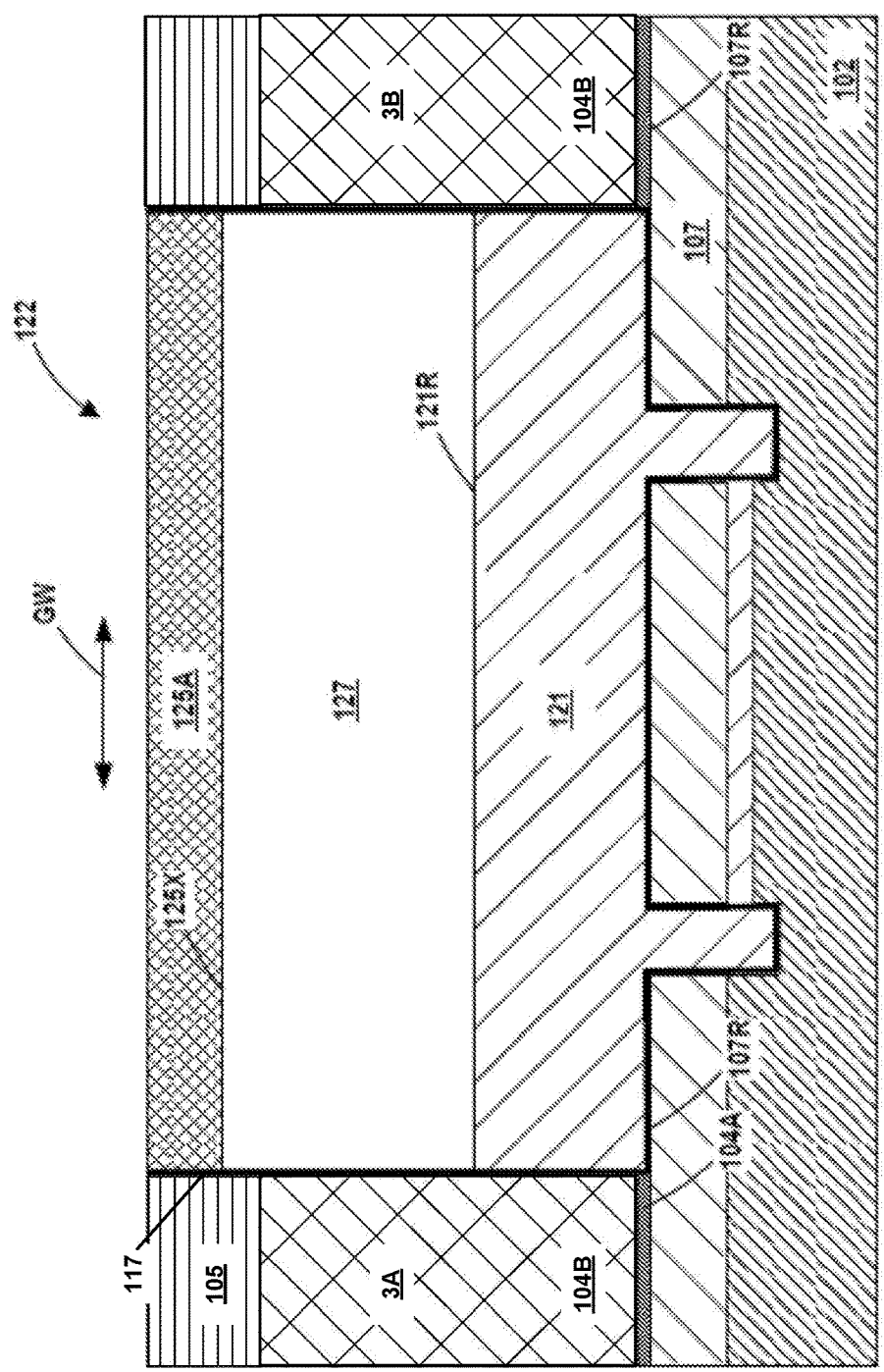

FIGS. 18-19 also depict one illustrative embodiment of the final SDB isolation structure 122 disclosed herein. As indicated, the depicted SDB isolation structure 122 comprises the conformal liner layer 117, the recessed insulating material 121, the air gap 127 and the SDB cap structure 125A. FIG. 20 is a plan view of the product 100 after the formation of the SDB isolation structure 122. FIG. 21 is a cross-sectional view taken where indicated in FIG. 20—through the SDB isolation structure 122 in the gate width (GW) direction of the transistor device. The SDB isolation structure 122 is positioned between the ends 103R and 103T of the first and second portions, respectively, of the fin 103, and a portion of the SDB isolation structure 122 is positioned within the trench 119. As indicated, the SDB isolation structure 122 essentially separates the initial sacrificial gate structure 104 of gate 3 into axially separate sacrificial gate structures 3A and 3B. In this example, the upper surface 121R of the insulating material 121 of the SDB isolation structure 122 is positioned at a level that is above the level of the upper surface 103S of the first and second fin portions. In other embodiments, the upper surface 121R of the insulating material 121 is positioned at a level that is 1-10 nm above a level corresponding to the upper surface 103S of the first and second fin portions. Also note that a portion of the conformal liner layer 117 positioned adjacent to the air gap 127 is substantially free of the insulating material 121. As indicated in these drawings, in one illustrative embodiment, the air gap 127 is bounded by the upper surface 121R of the insulating material 121, the conformal liner layer 117 and the bottom surface 125X of the cap structure 125A. In the depicted example, the bottom surface 125X is shown as being substantially planar. In a real-world device, the bottom surface 125X may have an irregular configuration or shape due to the manner in which the cap structure 125A is formed. Also note that, in the disclosed embodiment, the conformal liner layer 117 is positioned on and in contact with the entire perimeter of the cap structure 125A. Lastly, it should be noted that the sidewall spacer 112 is positioned adjacent opposing lateral sidewalls of the SDB isolation structure 122.

Figure 22:
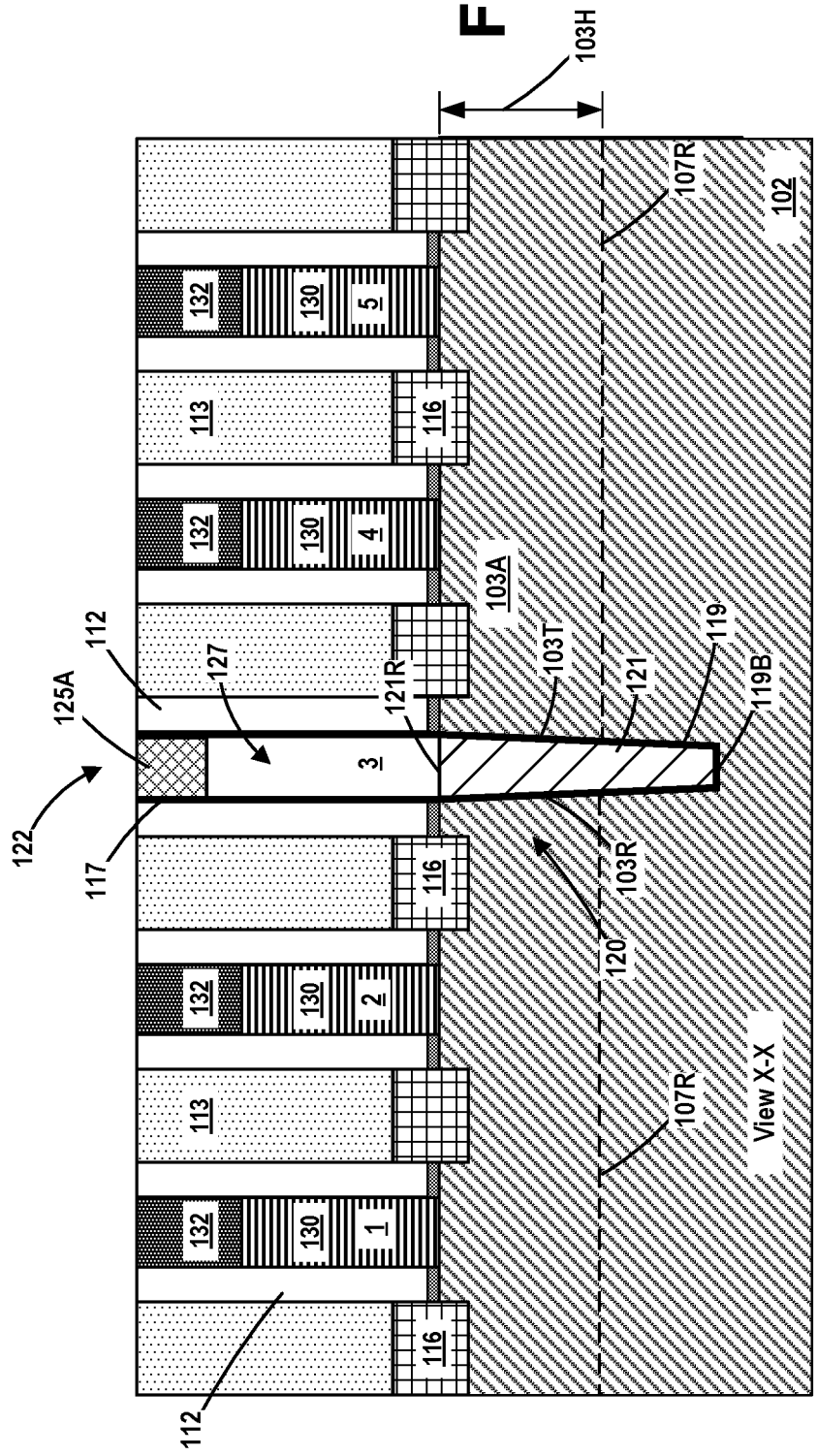
Figure 23:
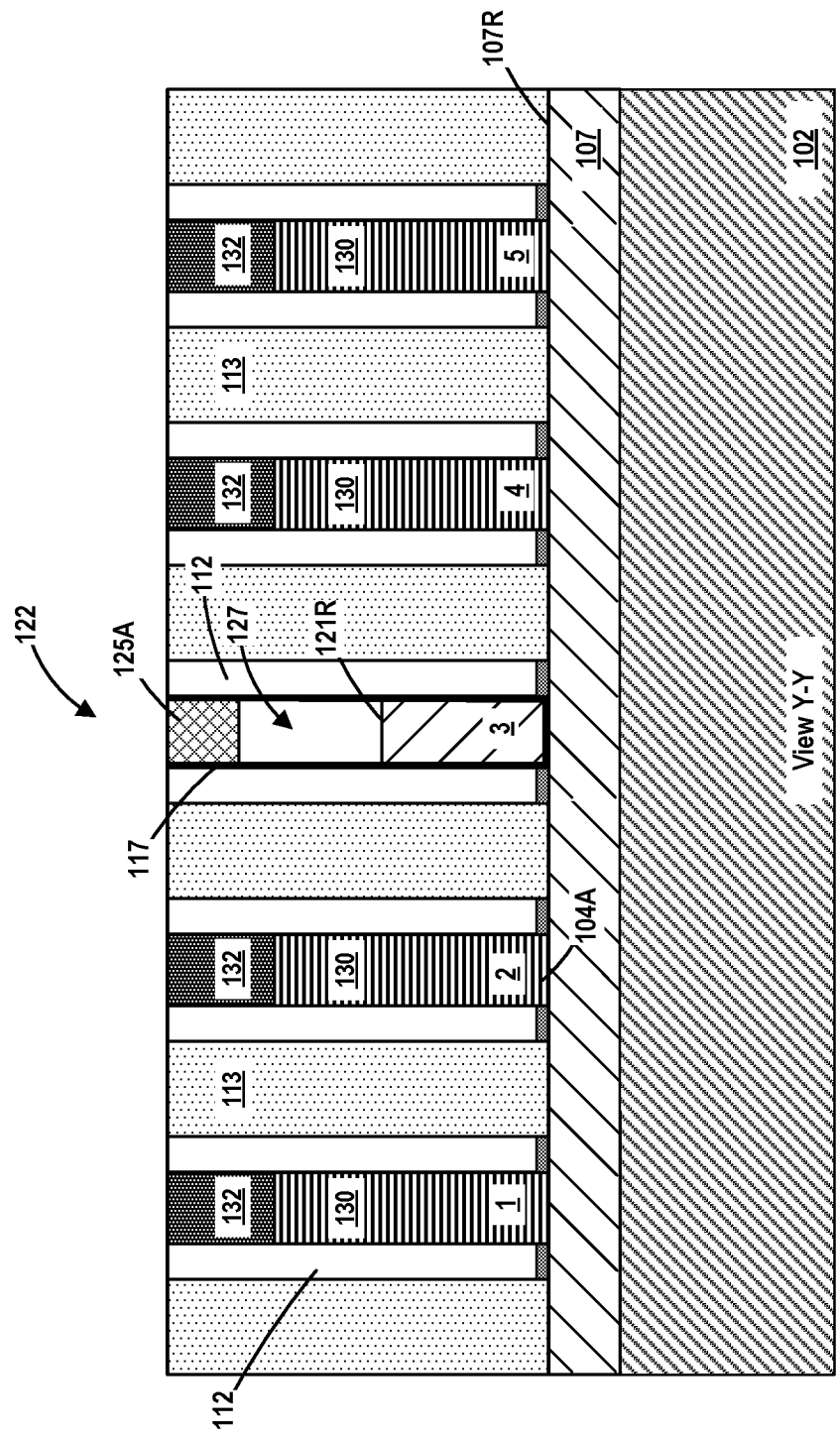

As noted above, the final gate structures 130 for the transistor devices disclosed herein will be manufactured using one illustrative embodiment of a replacement gate (or "gate-last") manufacturing technique. Accordingly, FIGS. 22-23, depict the product 100 after several process operations were performed. More specifically, one or more etching processes were performed to remove the sacrificial gate caps 105 selectively relative to the surrounding materials. This process operation exposes the underlying sacrificial gate structures 104. At that point, the sacrificial gate structures 104 were removed so as to form a plurality of replacement gate cavities located laterally between the spacers 112. Thereafter, in one illustrative process flow, the materials for the final gate structures 130 were formed in the replacement gate cavities. The final gate structures 130 depicted herein are intended to be representative in nature of any type of replacement gate structure that may be employed in manufacturing integrated circuit products. For example, the final gate structures 130 may comprise a high-k gate insulation layer (not separately shown), such as hafnium oxide, a material having a dielectric constant greater than 10, etc., and one or more conductive work-function adjusting metal layers (not separately shown), e.g., titanium, tantalum, titanium nitride, tantalum nitride, titanium carbide, etc., as well as one or more bulk conductive layers of material (e.g., titanium, tungsten, aluminum, etc.) Then, a CMP and or etch-back process was performed to remove excess amounts of the materials of the final gate structures 130 that were positioned outside of the replacement gate cavities. At that point, one or more recess etching processes were performed to reduce the height or recess the materials (e.g., the high-k gate insulation layer and the conductive materials of the final gate structures 130) within the replacement gate cavities.

Figure 24:
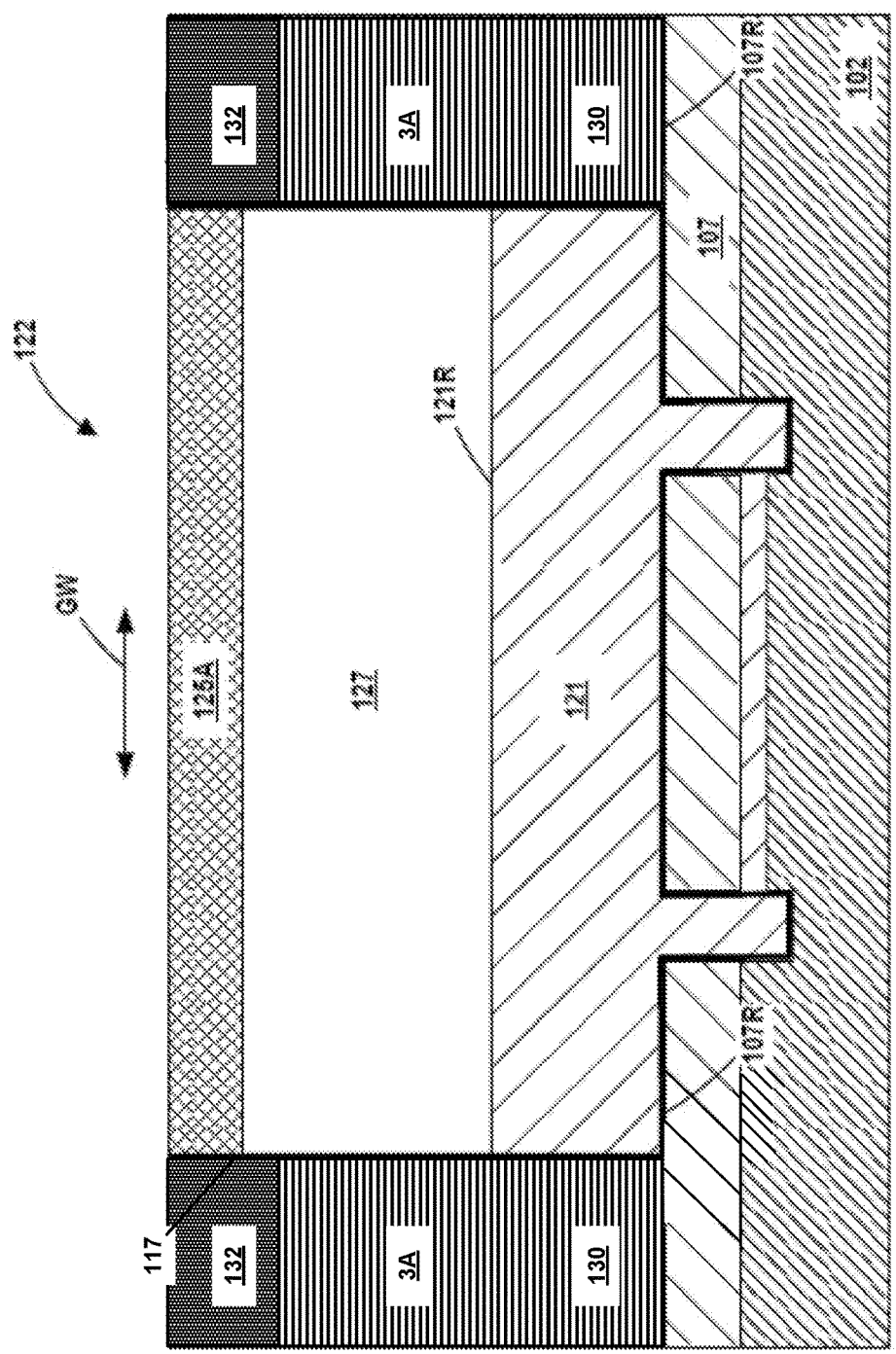

This process operation results in the formation of a cavity above each of the recessed final gate structures 130 and between the spacers 112. The amount of recessing of the materials of the final gate structures 130 may vary depending upon the particular application. Thereafter, final gate cap structures 132 were formed in the cavities above the recessed final gate structures 130. The final gate cap structures 132 may be comprised of a material such as silicon nitride. The final gate cap structures 132 may be formed by blanket-depositing the material for the final gate cap structures 132 across the product 100 and in the cavities above the recessed final gate structures 130, and thereafter performing a CMP and/or etch-back process to remove excess amounts of the gate cap material positioned outside of the cavities using the insulating material 113 and the spacers 112 as polish-stops. FIG. 24 is a cross-sectional view taken through the SDB isolation structure 122 in the gate width (GW) direction of the transistor device after the formation of the final gate structures 130 and final gate caps 132.

Figure 25:
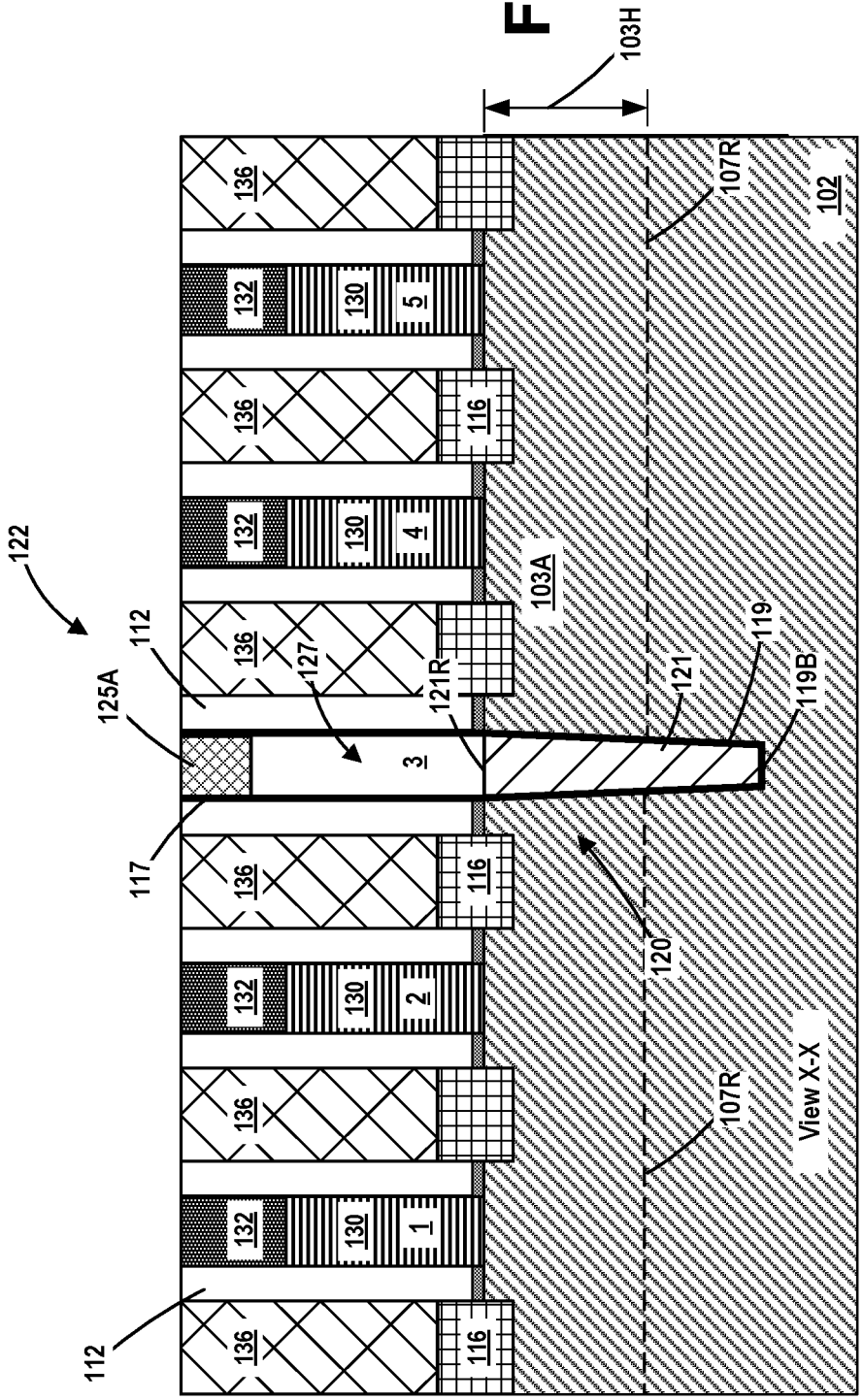
Figure 26:
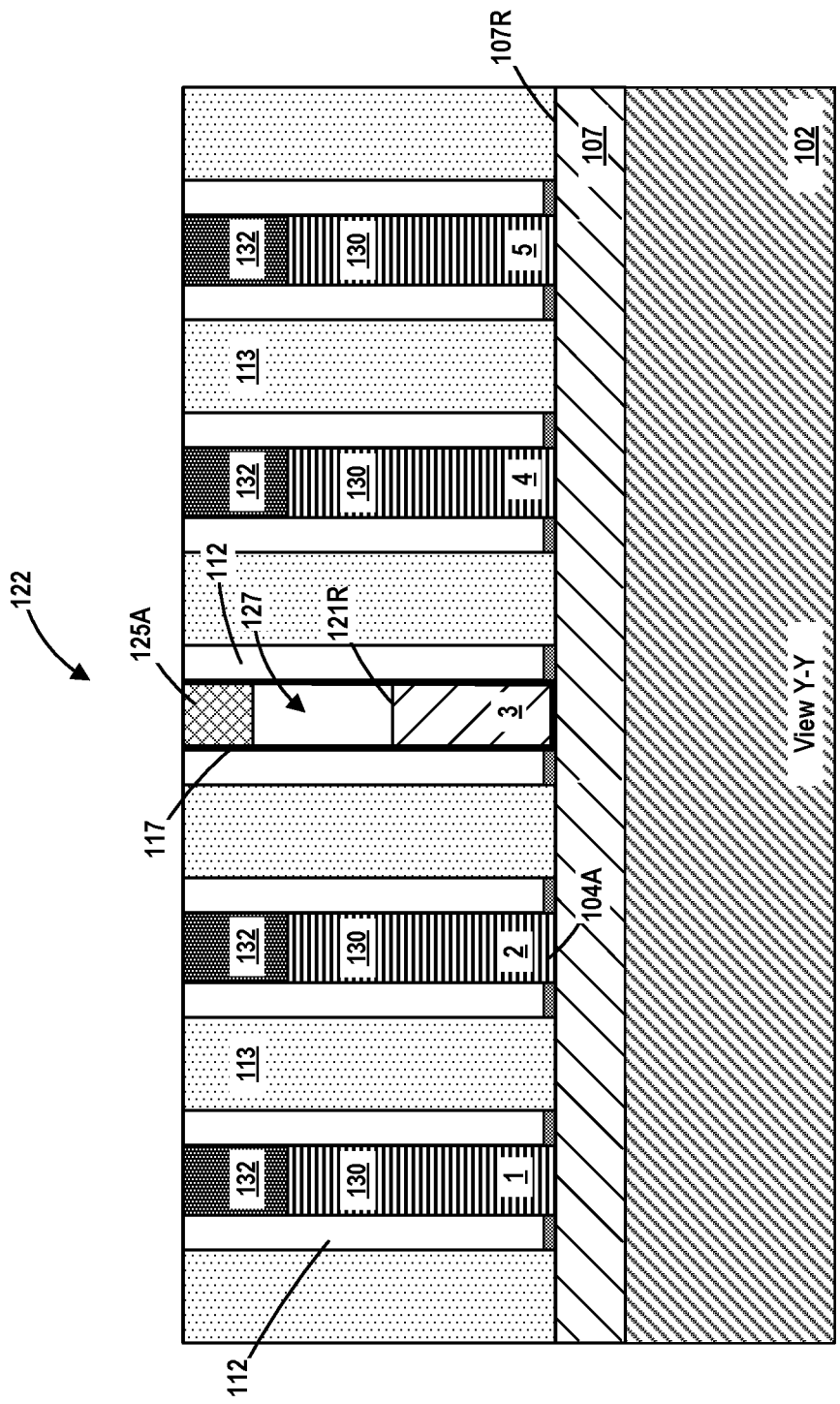

FIGS. 25-26 depict the product 100 after several process operations were performed to form source/drain metallization structures—conductive source/drain structures 136 (see FIG. 25)—that are conductively coupled to the epi material 116 in the source/drain regions of the devices. In one illustrative process flow, a patterned etch mask (not shown), e.g., a patterned OPL layer or photoresist, was formed on the product 100. The patterned etch mask comprises a plurality of openings at locations wherein it is desired to remove portions of the insulating material 113 selectively relative to surrounding materials so as to thereby expose the regions of epi material 116. One or more etching processes were then performed through the patterned etch mask to remove the exposed portions of the insulating material 113. Thereafter, the patterned etch mask was removed. Note that, in this depicted process flow, the insulating material 113 is not removed from above the isolation material 107 shown in FIG. 26 (view Y-Y). Thereafter, the illustrative conductive source/drain structures 136 (e.g., trench silicide structures) were formed so as to be conductively coupled to the epi semiconductor material 116 in the source/drain regions of the transistor devices. In the depicted example, the conductive source/drain structures 136 extend across substantially the entire active region of the devices in the gate width (GW) direction of the transistor devices (into and out of the plane of the drawing page in FIG. 25). Although not shown in the drawings, depending upon the particular application, one or more of the conductive source/drain structures 136 may extend across the isolation material 107 shown in FIG. 26 to another transistor device (not shown) on the product 100. In one illustrative embodiment, the conductive source/drain structures 136 may comprise a variety of different conductive materials, e.g., tungsten, cobalt, aluminum, a metal, a metal compound, cobalt silicide, nickel silicide, titanium silicide, nickel platinum silicide, etc. In one illustrative process flow, the material(s) for the conductive source/drain structures 136 was formed above the product 100 so as to over-fill the source/drain contact openings formed by removal of the insulating material 113. At that point, one or more CMP and/or etch-back processes were performed to planarize the upper surface of the product 100 and remove excess amounts of the material(s) for the conductive source/drain structures 136 that was positioned outside of the source/drain contact openings.

Figure 27:
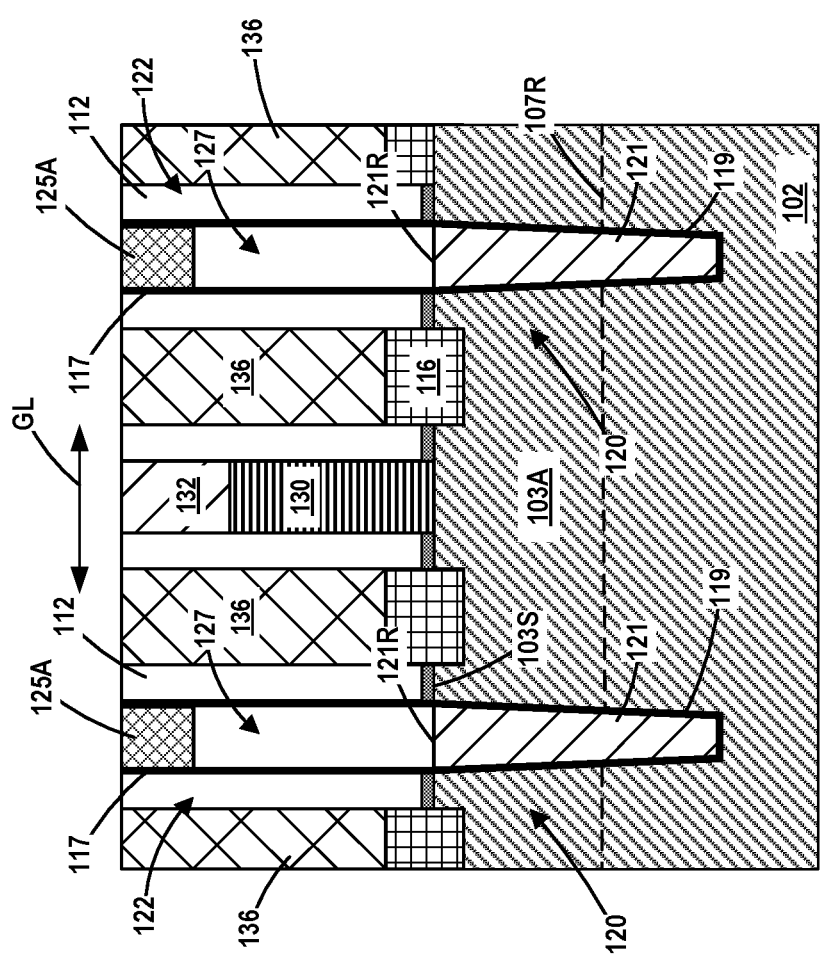

Of course, as will be readily appreciated by those skilled in the art after a complete reading of the present application, the subject matter disclosed herein may be employed in a variety of different applications. For example, FIG. 27 depicts an application in which a pair of spaced-apart SDB isolation structures 122 are positioned adjacent a single transistor device, with a region of epi material 116 on each side of the transistor device. As another example, FIG. 28 depicts an application in which three illustrative transistor devices are positioned between a pair of spaced-apart SDB isolation structures 122.

At the point of processing depicted in FIGS. 27-28, the fabrication of the product 100 may be completed by performing traditional manufacturing techniques to form various standard features on the IC product 100. For example, one or more layers of insulating material (not shown) may be formed on the product 100, followed by performing one or more CMP processes. At that point, traditional manufacturing operations may be performed to form various device-level contact structures. More specifically, a gate contact may be formed to conductively contact one or more of the gate structures 130 and a plurality of source/drain contacts may be formed to conductively contact the conductive source/drain structures 136. Thereafter, one or more metallization layers (not shown), that constitute the overall wiring pattern for the integrated circuit product 100, may be formed on the product 100 by performing traditional manufacturing processes. These metallization layers are typically comprised of layers of insulating material with conductive metal lines or conductive vias formed in the layers of material. The first metallization layer in an integrated circuit product is typically referred to as the "M1" layer (or in some cases the "M0" layer), while the conductive vias that are used to establish electrical connection between the M1 layer and lower level conductive structures are typically referred to as "V0" vias.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

What is claimed:

1. An integrated circuit product, comprising:
    a fin defined in a semiconductor substrate; and
    a single diffusion break (SDB) isolation structure positioned between a first fin portion of said fin and a second fin portion of said fin, said first fin portion comprising a first end surface, said second fin portion comprising a second end surface, said SDB isolation structure comprising:
        a conformal liner layer that engages said first end surface of said first fin portion and said second end surface of said second fin portion;
        an insulating material positioned on said conformal liner layer, said insulating material having an upper surface;

a cap structure positioned above said upper surface of said insulating material; and an air gap positioned between a bottom surface of said cap structure and said upper surface of said insulating material;

a first gate structure positioned above said first fin portion; and a second gate structure positioned above said second fin portion, wherein said SDB isolation structure electrically isolates said first gate structure from said second gate structure.

2. The product of claim 1, wherein said first fin portion comprises an upper surface located at a first level and wherein said upper surface of said insulating material is positioned at a level that is at or above said first level.

3. The product of claim 1, wherein a portion of said conformal liner layer adjacent said air gap is substantially free of said insulating material.

4. The product of claim 1, further comprising:
an isolation material positioned above said semiconductor substrate adjacent said first fin portion and said second fin portion, said isolation material comprising a lower surface; and
a trench that extends into said semiconductor substrate to a depth beyond a level corresponding to a position of said lower surface of said isolation material, wherein said conformal liner layer lines said trench, and wherein said upper surface of said insulating material is positioned at a level that is 1-10 nm above a level corresponding to an upper surface of said first fin portion.

5. The product of claim 1, further comprising a sidewall spacer positioned adjacent opposing lateral sidewalls of said SDB isolation structure, wherein said conformal liner layer is positioned on and in contact with said sidewall spacer.

6. The product of claim 1, wherein said conformal liner layer is positioned on and in contact with an outer perimeter of said cap structure.

7. The product of claim 1, wherein said air gap is bounded by said upper surface of said insulating material, said conformal liner layer and said bottom surface of said cap structure.

8. The product of claim 5, further comprising:
a first region of epi semiconductor material positioned on said first fin portion in a source/drain region of a first transistor device; and
a second region of epi semiconductor material positioned on said second fin portion in a source/drain region of a second transistor device, wherein said sidewall spacer contacts both said first and second regions of epi semiconductor material.

9. The product of claim 1, wherein said liner layer comprises a metal oxide, said insulating material comprises silicon dioxide, said cap structure comprises silicon nitride and said semiconductor substrate is a bulk silicon substrate.

10. An integrated circuit product, comprising:
a fin defined in a semiconductor substrate;
an isolation material positioned above said semiconductor substrate adjacent said fin, said isolation material comprising a lower surface,
a trench that extends into said semiconductor substrate to a depth beyond a level corresponding to a position of said lower surface of said isolation material; and
a single diffusion break (SDB) isolation structure positioned between a first fin portion of said fin and a second fin portion of said fin, said first fin portion comprising a first end surface and a first upper surface positioned at a first level, said second fin portion comprising a second end surface, wherein a portion of said SDB isolation structure is positioned within said trench, said SDB isolation structure comprising:
a conformal liner layer that engages said first end surface, said second end surface and lines said trench;
an insulating material positioned on and in contact with said conformal liner layer, wherein an upper surface of said insulating material is positioned at a level that is at or above said first level;
a cap structure positioned above said upper surface of said insulating material; and
an air gap, said air gap being bounded by said upper surface of said insulating material, said conformal liner layer and a bottom surface of said cap structure, wherein a portion of said conformal liner layer adjacent said air gap is substantially free of said insulating material.

11. The product of claim 10, wherein said upper surface of said insulating material is positioned at a level that is 1-10 nm above said first level.

12. The product of claim 10, further comprising a sidewall spacer positioned adjacent opposing lateral sidewalls of said SDB isolation structure, wherein said conformal liner layer is positioned on and in contact with said sidewall spacer.

13. The product of claim 12, wherein said conformal liner layer is positioned on and in contact with an outer perimeter of said cap structure.

14. An integrated circuit product, comprising:
a fin defined in a semiconductor substrate;
a single diffusion break (SDB) isolation structure positioned between a first fin portion of said fin and a second fin portion of said fin, said first fin portion comprising a first end surface and a first upper surface positioned at a first level, said second fin portion comprising a second end surface, said SDB isolation structure comprising:
a conformal liner layer that engages said first end surface of said first fin portion and said second end surface of said second fin portion;
an insulating material positioned on said conformal liner layer, said insulating material having an upper surface, wherein said upper surface of said insulating material is positioned at a level that is at or above said first level;
a cap structure positioned above said upper surface of said insulating material, wherein said conformal liner layer is positioned on and in contact with an outer perimeter of said cap structure; and
an air gap positioned between a bottom surface of said cap structure and said upper surface of said insulating material;
a first gate structure positioned above said first fin portion; and
a second gate structure positioned above said second fin portion, wherein said SDB isolation structure electrically isolates said first gate structure from said second gate structure.

15. The product of claim 14, wherein a portion of said conformal liner layer adjacent said air gap is substantially free of said insulating material.

16. The product of claim 15, further comprising:
an isolation material positioned above said semiconductor substrate adjacent said first fin portion and said second fin portion, said isolation material comprising a lower surface; and a trench that extends into said semiconductor substrate to a depth beyond a level corresponding to a position of said lower surface of said isolation material, wherein said conformal liner layer lines said trench.

17. The product of claim 14, wherein said air gap is bounded by said upper surface of said insulating material, said conformal liner layer and said bottom surface of said cap structure.

18. The product of claim 15, further comprising a sidewall spacer positioned adjacent opposing lateral sidewalls of said SDB isolation structure, wherein said conformal liner layer is positioned on and in contact with said sidewall spacer.

19. The product of claim 18, further comprising:
a first region of epi semiconductor material positioned on said first fin portion in a source/drain region of a first transistor device; and
a second region of epi semiconductor material positioned on said second fin portion in a source/drain region of a second transistor device, wherein said sidewall spacer contacts both said first and second regions of epi semiconductor material.

* * * * *